United States Patent
Makiyama

(10) Patent No.: US 10,263,103 B2
(45) Date of Patent: Apr. 16, 2019

(54) SEMICONDUCTOR APPARATUS

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/290,329

(22) Filed: Oct. 11, 2016

(65) Prior Publication Data

US 2017/0125561 A1    May 4, 2017

(30) Foreign Application Priority Data

Oct. 30, 2015    (JP) ................................ 2015-215088

(51) Int. Cl.
| | |
|---|---|
| *H01L 29/00* | (2006.01) |
| *H01L 29/778* | (2006.01) |
| *H01L 29/12* | (2006.01) |
| *H01L 29/20* | (2006.01) |
| *H01L 29/423* | (2006.01) |
| *H01L 29/43* | (2006.01) |
| *H01L 29/51* | (2006.01) |

(Continued)

(52) U.S. Cl.
CPC ........ *H01L 29/7783* (2013.01); *H01L 29/122* (2013.01); *H01L 29/2003* (2013.01); *H01L 29/4232* (2013.01); *H01L 29/432* (2013.01); *H01L 29/517* (2013.01); *H01L 29/66462* (2013.01); *H01L 29/7786* (2013.01); *H01L 29/41766* (2013.01)

(58) Field of Classification Search
CPC ............. H01L 29/7783; H01L 29/2003; H01L 29/122; H01L 29/4232
See application file for complete search history.

(56) References Cited

U.S. PATENT DOCUMENTS 7,777,253 B2 * 8/2010 Sato .................. H01L 29/42364
                                                                      257/194
8,471,309 B2 * 6/2013 Yamada .............. H01L 29/2003
                                                                      257/288

(Continued)

FOREIGN PATENT DOCUMENTS

| JP | 2002-359256 | 12/2002 |
|---|---|---|
| JP | 2010-010489 | 1/2010 |

(Continued)

OTHER PUBLICATIONS

Lu et al., "AlGaN/GaN HEMTS on SiC with over 100 GHz fT and Low Microwave Noise", IEEE Transaction on Electron Devices, vol. 48, No. 3, pp. 581-585, Mar. 2001.*

(Continued)

*Primary Examiner* — Nikolay K Yushin
(74) *Attorney, Agent, or Firm* — Fujitsu Patent Center

(57) ABSTRACT

A semiconductor apparatus includes an electron transit layer formed of a nitride semiconductor over a substrate; an electron supply layer formed of a nitride semiconductor including In over the electron transit layer; a cap layer formed of a nitride semiconductor over the electron supply layer; an insulation film formed over the cap layer; a source electrode and a drain electrode formed over the electron transit layer or the electron supply layer; and a gate electrode formed over the cap layer. A quantum well is formed by the cap layer.

13 Claims, 42 Drawing Sheets

(51) Int. Cl.
*H01L 29/66* (2006.01)
*H01L 29/417* (2006.01)

(56) References Cited

U.S. PATENT DOCUMENTS

| | | | | |
|---|---|---|---|---|
| 8,569,124 | B2* | 10/2013 | Akiyama | H01L 21/324 257/288 |
| 8,648,389 | B2* | 2/2014 | Makabe | H01L 21/02378 257/194 |
| 9,123,534 | B2* | 9/2015 | Yui | H01L 21/0254 |
| 9,136,107 | B2* | 9/2015 | Katani | H01L 21/02112 |
| 9,379,229 | B2* | 6/2016 | Ohki | H01L 29/2003 |
| 2006/0011946 | A1* | 1/2006 | Toda | H01S 5/32341 257/202 |
| 2011/0272742 | A1* | 11/2011 | Akiyama | H01L 21/324 257/194 |
| 2012/0049180 | A1* | 3/2012 | Yamada | H01L 29/2003 257/43 |
| 2012/0217507 | A1* | 8/2012 | Ohki | H01L 29/2003 257/76 |
| 2013/0105863 | A1 | 5/2013 | Lee et al. | |
| 2014/0361308 | A1* | 12/2014 | Yui | H01L 21/0254 257/76 |
| 2015/0069408 | A1 | 3/2015 | Nanjo et al. | |
| 2015/0279722 | A1 | 10/2015 | Kikuchi | |

FOREIGN PATENT DOCUMENTS

| | | |
|---|---|---|
| JP | 2013-098556 | 5/2013 |
| JP | 2014-157993 | 8/2014 |
| JP | 2015-073073 | 4/2015 |

OTHER PUBLICATIONS

JPOA—Office Action dated Feb. 26, 2019 issued with respect to the basic Japanese Patent Application No. 2015-215088 with full machine translated office action.

* cited by examiner

SEMICONDUCTOR APPARATUS

CROSS-REFERENCE TO RELATED APPLICATIONS

This application is based upon and claims the benefit of priority of the prior Japanese Priority Application No. 2015-215088 filed on Oct. 30, 2015, the entire contents of which are hereby incorporated by reference.

FIELD

The present disclosure relates to a semiconductor apparatus, and a method of manufacturing a semiconductor apparatus.

BACKGROUND

Nitride semiconductors such as GaN, AlN, and InN, or mixed crystals of these materials have wide band gaps, and are used as high-output electronic devices, short-wavelength-light emitting devices, and the like. For example, GaN as a nitride semiconductor has the band gap of 3.4 eV, which is greater than the band gap of 1.1 eV of Si and the band gap of 1.4 eV of GaAs.

As such high-output electronic devices, field-effect transistors (FET), high-electron-mobility transistors (HEMT), and the like have been available (see, for example, Patent Document 1). A HEMT that uses nitride semiconductors is used for a high-output, a high-efficiency amplifier, a high-power switching device, or the like. Specifically, in a HEMT that uses AlGaN in an electron supply layer and GaN in an electron transit layer, piezoelectric polarization or the like is generated in AlGaN due to distortion caused by different lattice constants between AlGaN and GaN, and high-density 2DEG (Two-Dimensional Electron Gas) is generated. Therefore, such a HEMT can operate at high-voltage, and can be used for a high-efficiency switching element, a high-voltage resistance electric power device for an electric vehicle and the like.

Incidentally, some devices using nitride semiconductors for super high frequency may use InAlN having high spontaneous polarization instead of AlGaN in an electron supply layer to implement a high-output device. InAlN can induce high-density, two-dimensional electron gas even if thinly formed, and hence, has drawn attention as a material that can realize both high output and high frequency. Such a HEMT has an insulation film of SiN or the like formed over the electron supply layer, as a passivation film.

RELATED-ART DOCUMENTS

Patent Documents

[Patent Document 1] Japanese Laid-open Patent Publication No. 2002-359256

Incidentally, when a high drain voltage is applied to a HEMT having a structure in which the electron supply layer is formed of InAlN, and an SiN film as a passivation film is formed over the electron supply layer, electrons are trapped by the SiN film, and current collapse tends to be generated. Such generation of current collapse is not preferable because the on-resistance becomes high when operated at a high frequency. Note that such a phenomenon in that electrons are trapped by the SiN film due to application of a high drain voltage is generated more notably with an electron supply layer formed of InAlN than that formed of AlGaN.

Therefore, it has been desired to have a HEMT having a structure in which the electron supply layer is formed of InAlN, and a passivation film of SiN or the like is formed over the electron supply layer, that can prevent current collapse.

SUMMARY

According to an embodiment, a semiconductor apparatus includes an electron transit layer formed of a nitride semiconductor over a substrate; an electron supply layer formed of a nitride semiconductor including In on the electron transit layer; a cap layer formed of a nitride semiconductor over the electron supply layer; an insulation film formed over the cap layer; a source electrode and a drain electrode formed over the electron transit layer or the electron supply layer; and a gate electrode formed over the cap layer. A quantum well is formed by the cap layer.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments will be described with reference to the drawings. Note that the same numerical codes are assigned to the same members, and their description may be omitted.

According to a disclosed semiconductor apparatus, it is possible to provide a HEMT having a structure in which the electron supply layer is formed of InAlN, and a passivation film of SiN or the like is formed over the electron supply layer, that can prevent current collapse.

First Embodiment

Figure 1:
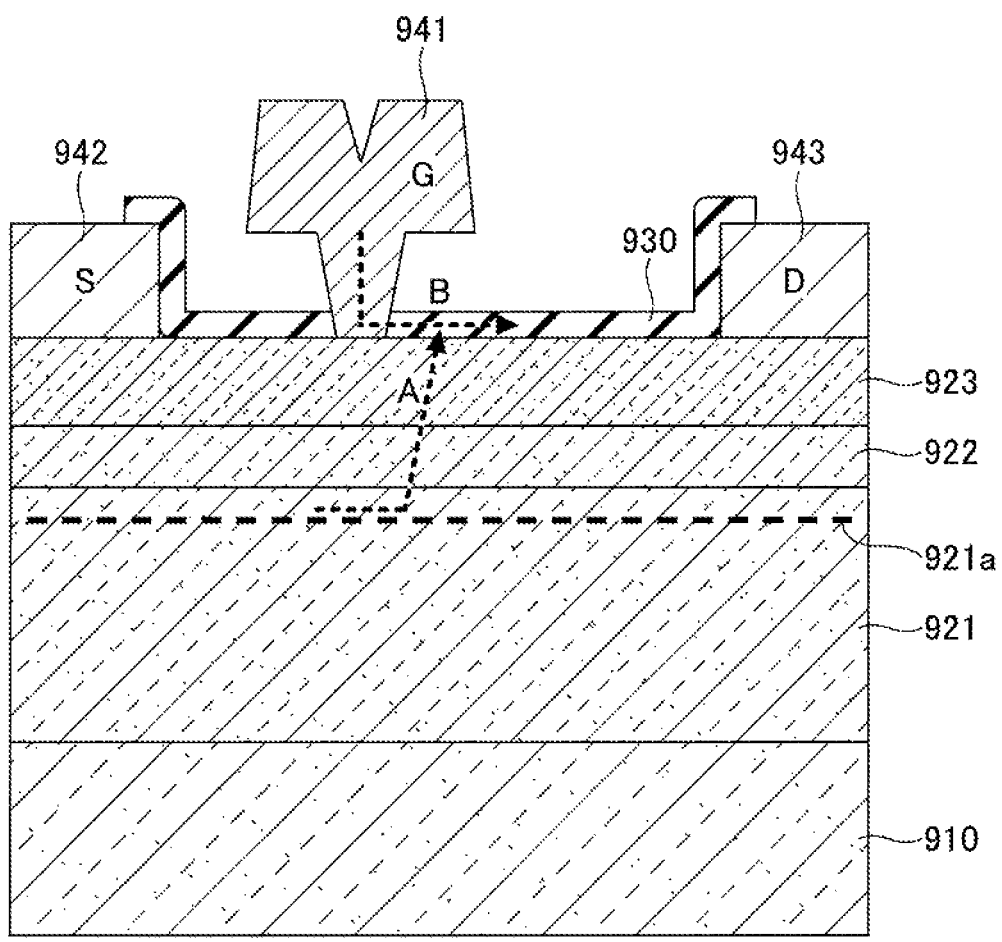
FIG. 1 is a structural diagram of a semiconductor apparatus using InAlN in an electron supply layer.

First, a HEMT will be described based on FIG. 1 that is a semiconductor apparatus having a structure in which an electron supply layer is formed of InAlN, and an insulation film of SiN or the like is formed over the electron supply layer. As illustrated in FIG. 1, this semiconductor apparatus has a buffer layer (not illustrated), an electron transit layer 921 formed of i-GaN, an intermediate layer 922 formed of AlN, and an electron supply layer 923 formed of InAlN, stacked over a substrate 910. A gate electrode 941, a source electrode 942, and a drain electrode 943 are formed over the electron supply layer 923. An insulation film 930 of SiN or the like is formed as a passivation film over the electron supply layer 923 in a region where the gate electrode 941, the source electrode 942, and the drain electrode 943 are not formed. The substrate 910 is formed of a semi-insulative SiC substrate, and 2DEG 921a is generated in the electron transit layer 921 in the neighborhood of the interface between the electron transit layer 921 and the intermediate layer 922.

If a high voltage is applied to the drain electrode 943 in the semiconductor apparatus having the structure illustrated in FIG. 1, electrons are trapped in the insulation film 930. When electrons are trapped in the insulation film 930 as such, the density of the 2DEG 921a is reduced, and current collapse is generated. Two paths may be considered as injection paths of electrons into the insulation film 930 when a high voltage is applied to the drain electrode 943.

Figure 2:
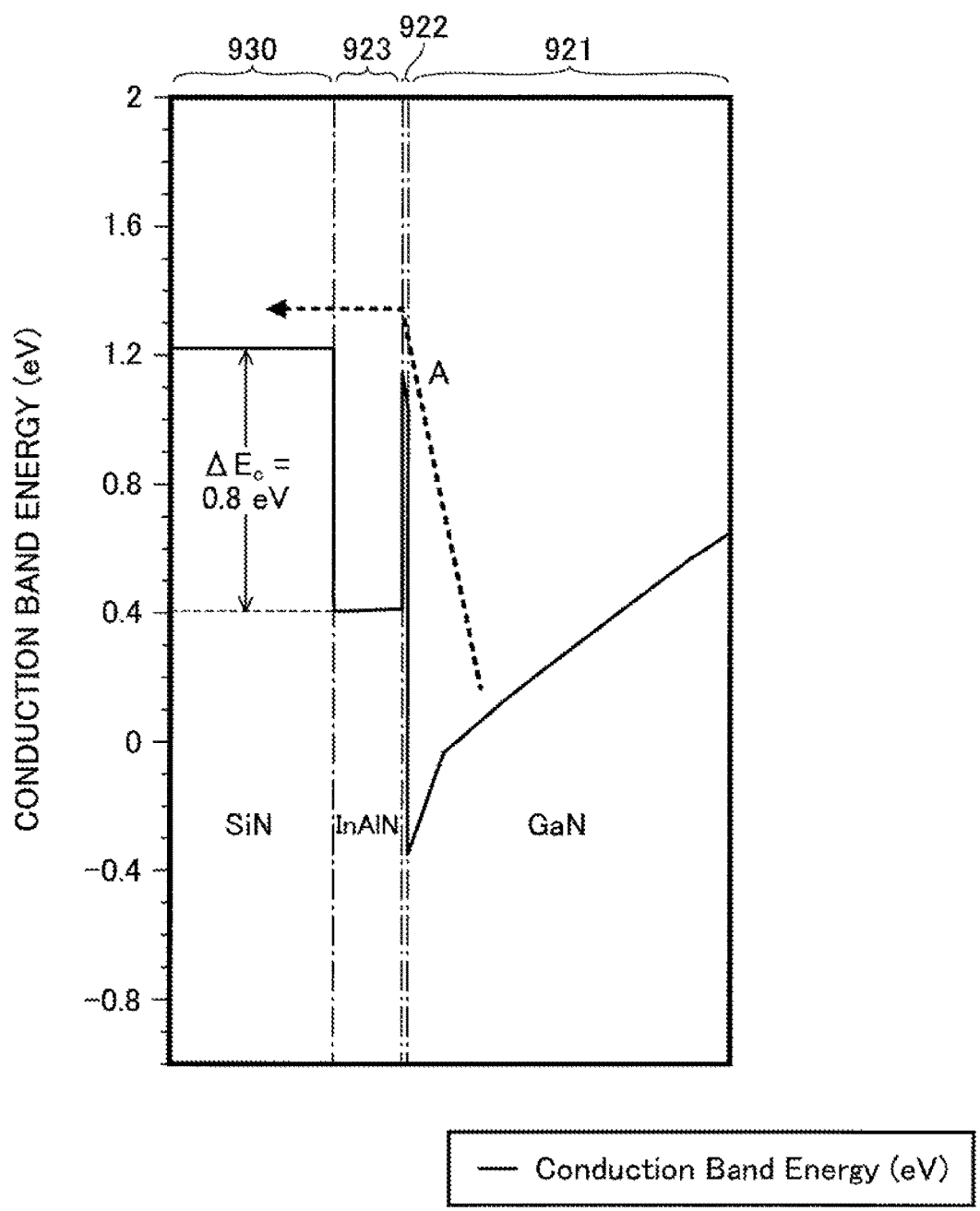
FIG. 2 is a band diagram of a semiconductor apparatus illustrated in FIG. 1 in the direction perpendicular to the substrate surface.

One of the paths is a path through which electrons in the 2DEG 921a pass the intermediate layer 922 and the electron supply layer 923, and are injected into the insulation film 930, as designated by a dashed line arrow A in FIG. 1. The reason why this path is generated is considered, as illustrated in FIG. 2, that a difference ΔEc along the bottom of the conduction band between the electron supply layer 923 formed of InAlN, and the insulation film 930 formed of SiN, is as low as about 0.8 eV. When the difference ΔEc along the bottom of the conduction band between the electron supply layer 923 and the insulation film 930 is low as such, if a high voltage is applied to the drain electrode 943, electrons of the 2DEG 921*a* pass the intermediate layer 922 and the electron supply layer 923, and are injected into the insulation film 930 comparatively easily. Note that FIG. 2 is a band diagram of the semiconductor apparatus illustrated in FIG. 1 in the direction perpendicular to the substrate surface.

Figure 3:
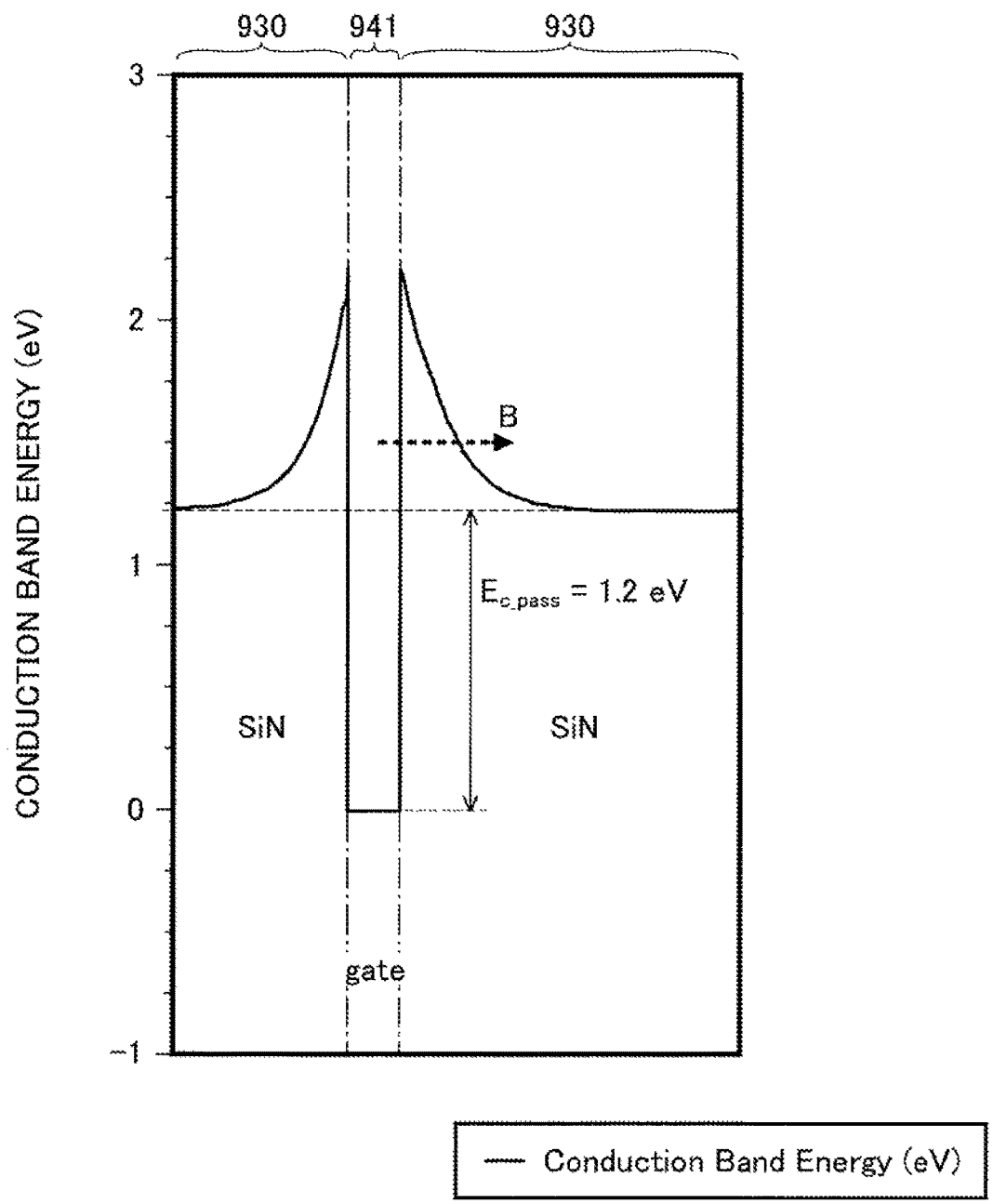
FIG. 3 is a band diagram of a semiconductor apparatus illustrated in FIG. 1 in the direction along the substrate surface.

The other path is a path through which electrons are injected into the insulation film 930 directly from the gate electrode 941 as designated by a dashed line arrow B in FIG. 1. This is generated because, as illustrated in FIG. 3, the bottom of the conduction band is lowered as SiN forming the insulation film 930 is formed over the electron supply layer 923 formed of InAlN. Therefore, the difference $E_{c\_pass}$ between the Fermi level in the gate electrode 941, and the bottom of the conduction band of SiN forming the insulation film 930 becomes as low as about 1.2 eV, and a region forming a barrier is thin, and hence, electrons are injected into the insulation film 930 from the gate electrode 941. Note that FIG. 3 is a band diagram of the semiconductor apparatus illustrated in FIG. 1 in the direction along the substrate surface.

(Semiconductor Apparatus)

Figure 4:
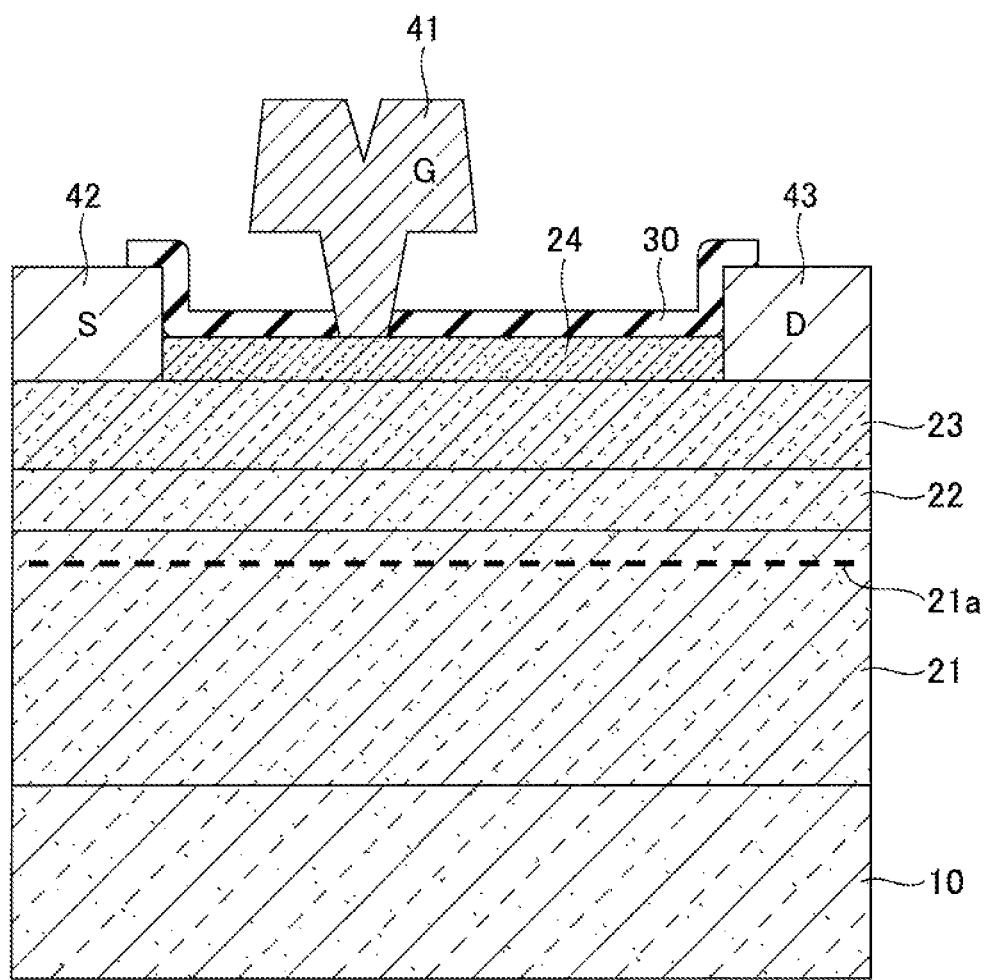
FIG. 4 is a structural diagram of a semiconductor apparatus according to a first embodiment.

Next, a semiconductor apparatus according to a first embodiment will be described based on FIG. 4. As illustrated in FIG. 4, the semiconductor apparatus according to the embodiment has a buffer layer (not illustrated), an electron transit layer 21, an intermediate layer 22, an electron supply layer 23, and a cap layer 24, stacked over a substrate 10. According to the embodiment, the electron transit layer 21 is formed of i-GaN, the intermediate layer 22 is formed of AlN, the electron supply layer 23 is formed of InAlN, and the cap layer 24 is formed of InGaN. This structure generates 2DEG 21*a* in the electron transit layer 21 in the neighborhood of the interface between the electron transit layer 21 and the intermediate layer 22. Note that the substrate 10 is formed of a semi-insulative SiC substrate. A gate electrode 41 is formed over the cap layer 24, and a source electrode 42 and a drain electrode 43 are formed over the electron supply layer 23. A region over the cap layer 24 where the gate electrode 41 is not formed, has an insulation film 30 of SiN or the like formed as a passivation film. Alternatively, the source electrode 42 and the drain electrode 43 may be formed over the electron transit layer 21. Further, the electron supply layer 23 may be formed of InAlGaN.

Figure 5:
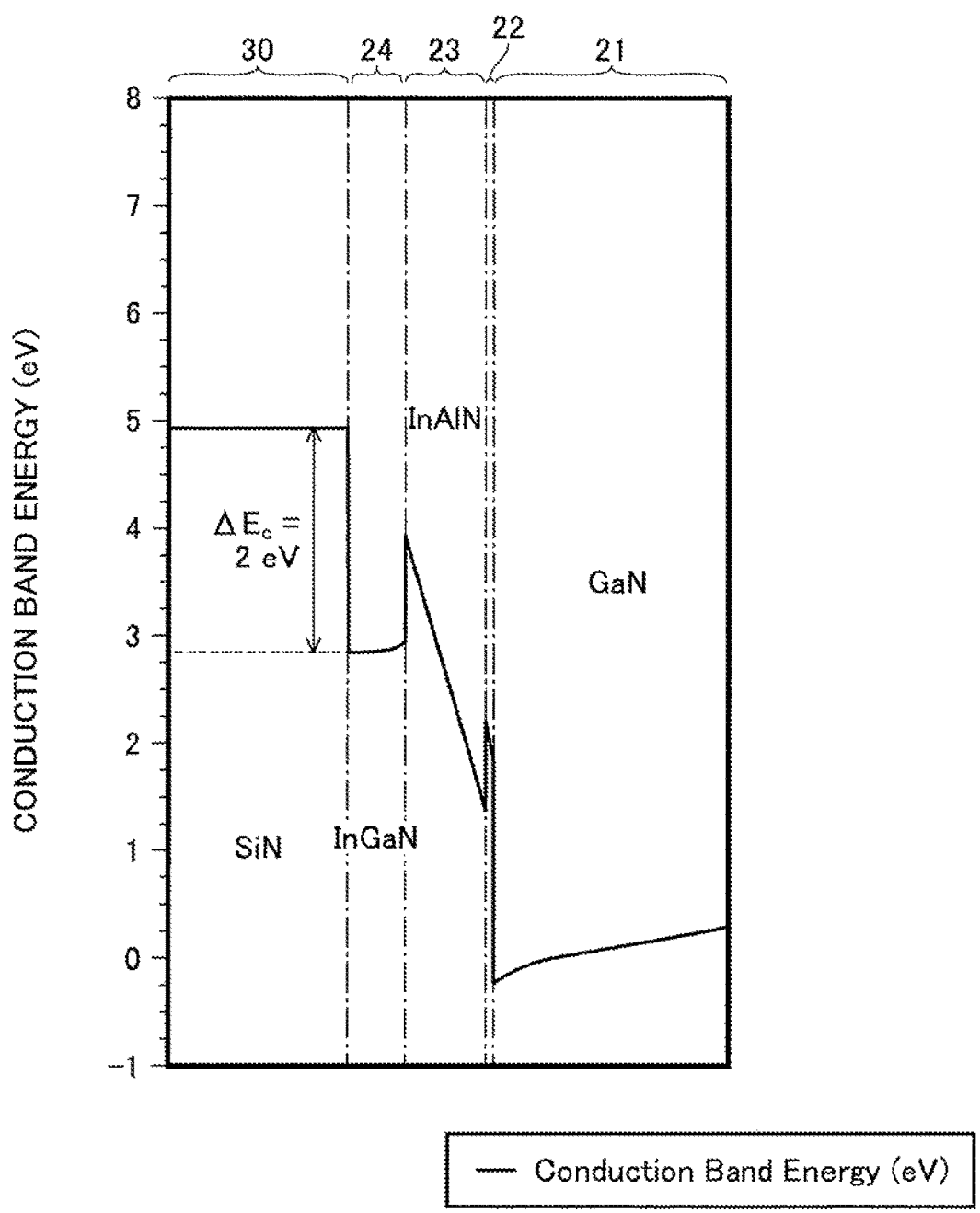
FIG. 5 is a first band diagram of a semiconductor apparatus in the direction perpendicular to the substrate surface according to the first embodiment.

Band structures of the semiconductor apparatus according to the embodiment will be described based on FIG. 5 and FIG. 6. FIG. 5 is a band diagram of the semiconductor apparatus in the direction perpendicular to the substrate surface, and FIG. 6 is a band diagram of the semiconductor apparatus in the direction along the substrate surface, according to the embodiment.

As illustrated in FIG. 5, in the semiconductor apparatus according to the embodiment, the difference ΔEc along the bottom of the conduction band between the cap layer 24 formed of InGaN and the insulation film 30 formed of SiN, is about 2.0 eV. Therefore, the cap layer 24 formed between the insulation film 30 and the electron supply layer 23 forms a quantum well, which makes the barrier from the cap layer 24 to the insulation film 30 high. Consequently, even if a high voltage is applied to the drain electrode 43, electrons of the 2DEG 21*a* are not injected into the insulation film 30.

Figure 6:
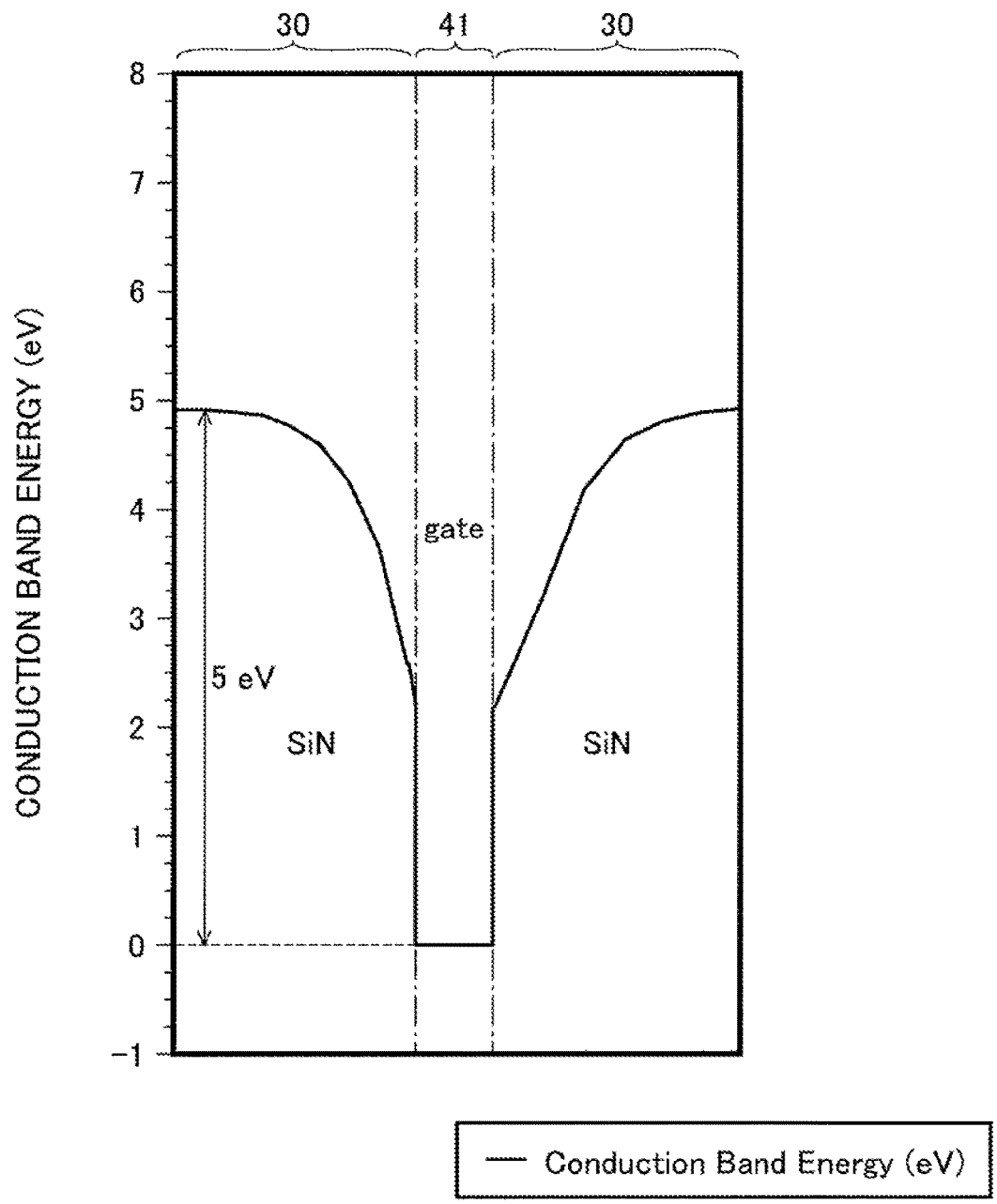
FIG. 6 is a first band diagram of a semiconductor apparatus in the direction along the substrate surface according to the first embodiment.

Also, as illustrated in FIG. 6, the bottom of the conduction band is raised because SiN forming the insulation film 30 is formed over the cap layer 24 formed of InAlN. Therefore, the difference $E_{c\_pass}$ between the Fermi level in the gate electrode 41 and the bottom of the conduction band of SiN forming the insulation film 30 becomes as high as about 5.0 eV, and hence, electrons are not injected into the insulation film 30 from the gate electrode 41.

Therefore, in the semiconductor apparatus according to the embodiment, even if a high voltage is applied to the drain electrode 43, electrons are not injected into the insulation film 30, and hence, electrons are trapped in the insulation film 30. Therefore, the density of electrons of the 2DEG 21*a* is not reduced, and generation of current collapse is prevented.

(Characteristic of Current Collapse)

Figure 7:
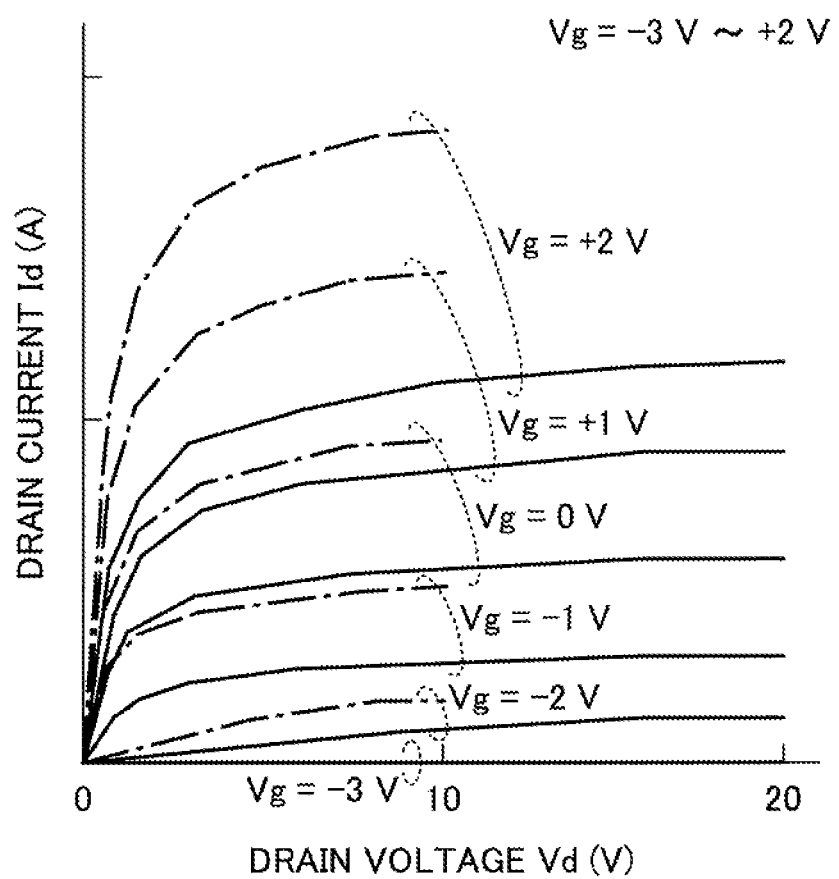
FIG. 7 is a correlation diagram of the drain voltage and the drain current of a semiconductor apparatus illustrated in FIG. 1.
Figure 8:
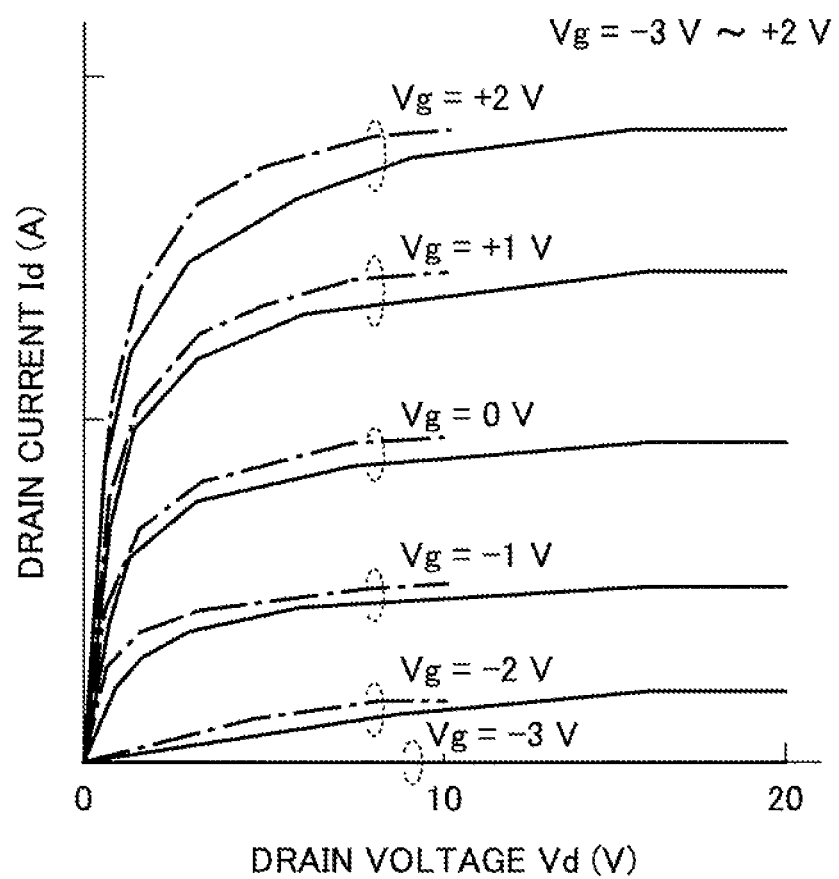
FIG. 8 is a correlation diagram of the drain voltage and the drain current of a semiconductor apparatus according to the first embodiment.

Next, a characteristic of current collapse in the semiconductor apparatus according to the embodiment will be described. FIG. 7 illustrates a relationship between the drain voltage Vd and the drain current Id in a semiconductor apparatus having the structure illustrated in FIG. 1, in cases where the source voltage is set to 0 V, and the gate voltage Vg is changed to make the drain voltage rise up to 10 V, and up to 20 V. Also, FIG. 8 illustrates a relationship between the drain voltage Vd and the drain current Id in a semiconductor apparatus having the structure illustrated in FIG. 4, in cases where the source voltage is set to 0 V, and the gate voltage Vg is changed to make the drain voltage rise up to 10 V, and up to 20 V. Note that FIG. 7 and FIG. 8 illustrate cases where the gate voltage Vg is changed to be −3, −2, −1, 0, +1, and +2 V.

As illustrated in FIG. 7, in the semiconductor apparatus having the structure illustrated in FIG. 1, the drain current Id is remarkably reduced in the cases where the drain voltage Vd has risen up to 20 V, compared to the cases where the drain voltage Vd has risen up to 10 V, and thus, current collapse is generated. Therefore, the on-current is reduced, and the on-resistance becomes higher. On the other hand, as illustrated in FIG. 8, in the semiconductor apparatus having the structure illustrated in FIG. 4, the drain current Id is not reduced much in the cases where the drain voltage Vd has risen up to 20 V, compared to the cases where the drain voltage Vd has risen up to 10 V, and hence, current collapse is prevented. Therefore, the on-current is not reduced much, and the on-resistance does not become high as much.

(Cap Layer 24)

Next, the cap layer 24 of the semiconductor apparatus according to the embodiment will be described. In the semiconductor apparatus according to the embodiment, the cap layer 24 formed between the electron supply layer 23 and the insulation film 30, may be formed of a material other than InGaN as long as a quantum well is formed with the material.

Figure 9:
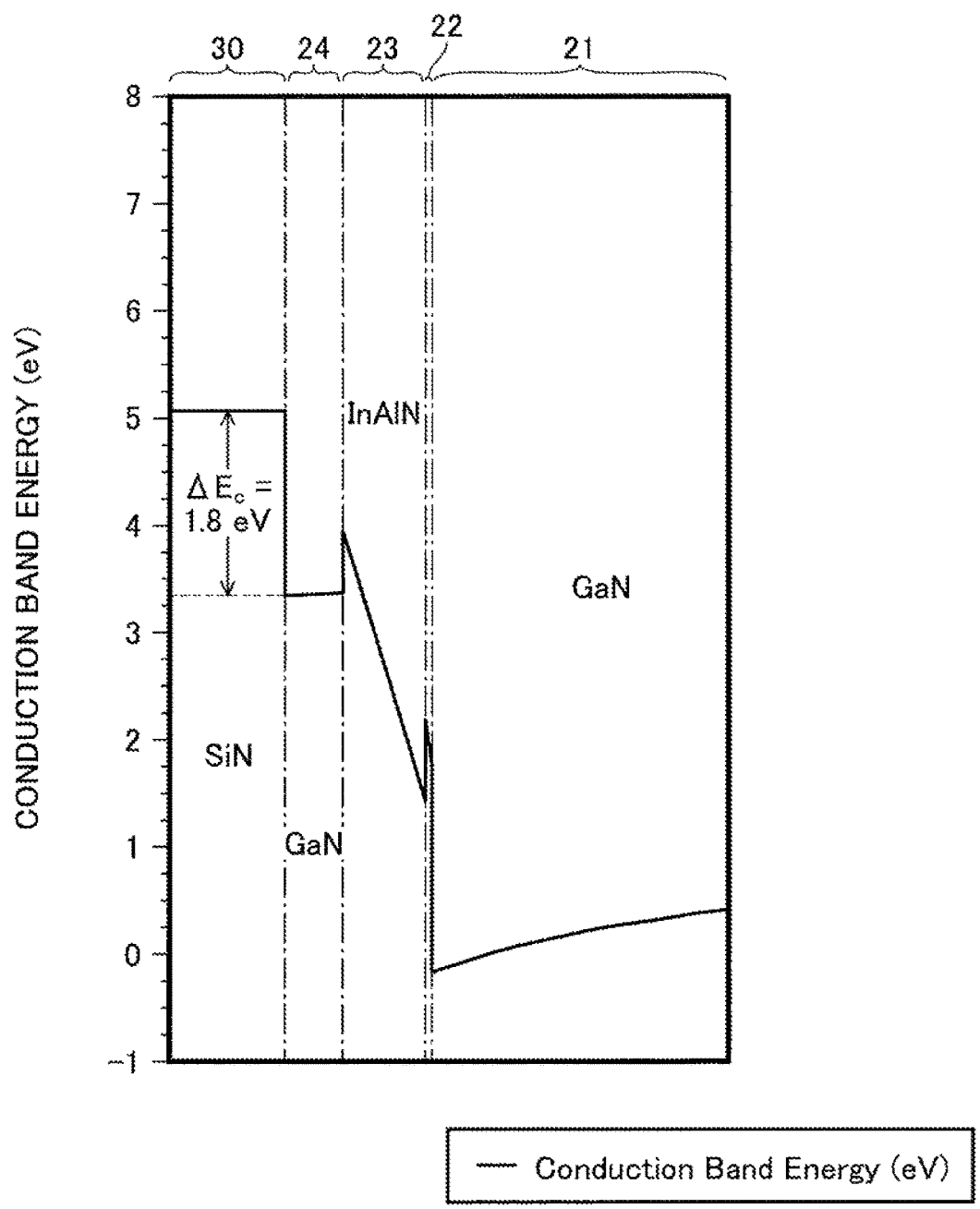
FIG. 9 is a second band diagram of a semiconductor apparatus in the direction perpendicular to the substrate surface according to the first embodiment.
Figure 10:
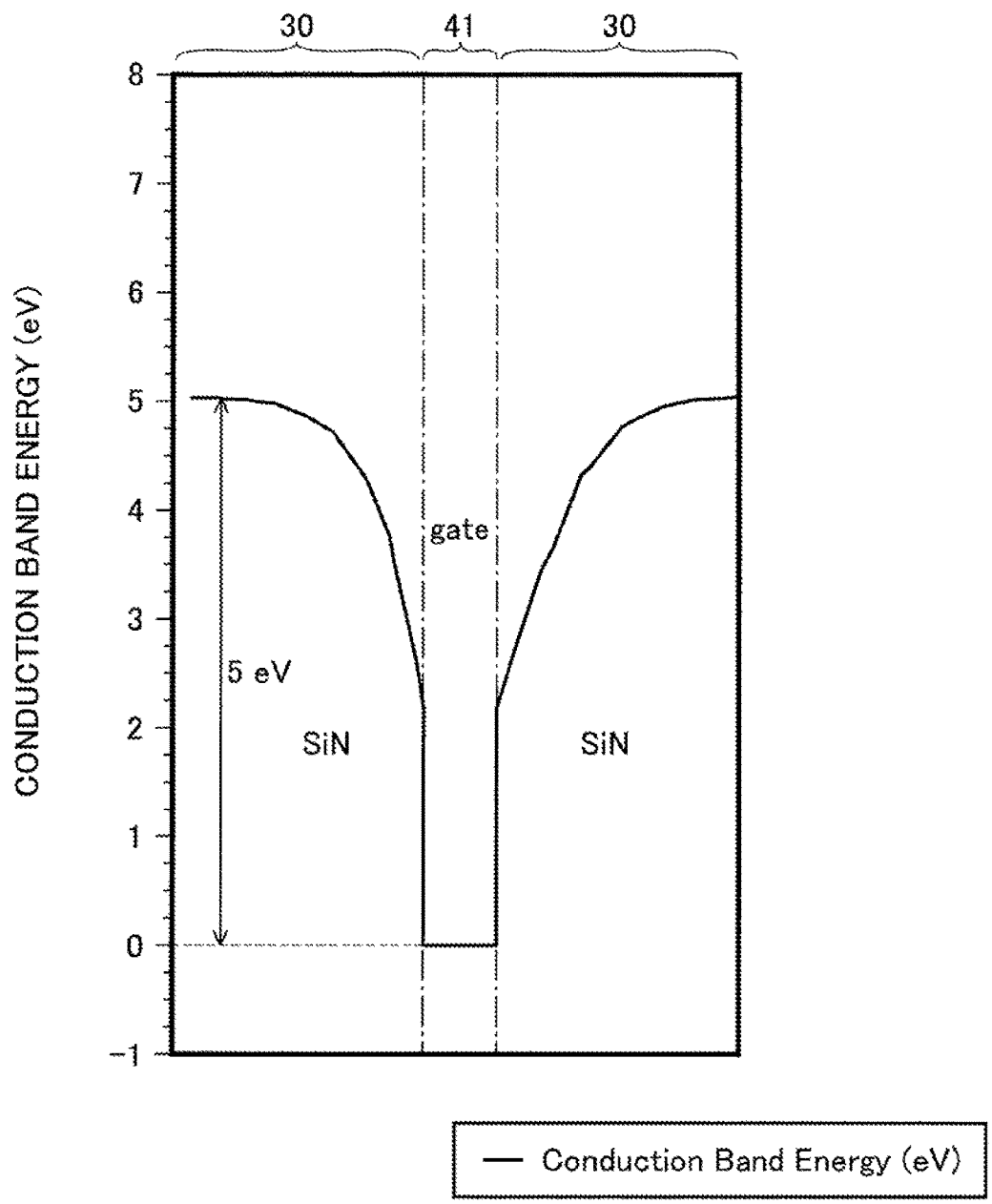
FIG. 10 is a second band diagram of a semiconductor apparatus in the direction along the substrate surface according to the first embodiment.

FIG. 9 and FIG. 10 are band diagrams in a case where the cap layer 24 is formed of GaN in the semiconductor apparatus according to the embodiment. FIG. 9 is a band diagram in the direction perpendicular to the substrate surface, and FIG. 10 is a band diagram in the direction along the substrate surface, in the semiconductor apparatus having this structure.

As illustrated in FIG. 9, in the semiconductor apparatus having this structure, the difference ΔEc along the bottom of the conduction band between the cap layer 24 formed of GaN and the insulation film 30 formed of SiN, is about 1.8 eV. Therefore, the cap layer 24 formed between the insulation film 30 and the electron supply layer 23 forms a quantum well, which makes the barrier from the cap layer 24 to the insulation film 30 high. Consequently, even if a high voltage is applied to the drain electrode 43, electrons of the 2DEG 21*a* are not injected into the insulation film 30.

Also, as illustrated in FIG. 10, the bottom of the conduction band is raised because SiN forming the insulation film 30 is formed over the cap layer 24 formed of GaN. Therefore, the difference $E_{c\_pass}$ between the Fermi level in the gate electrode 41 and the bottom of the conduction band of SiN forming the insulation film 30 becomes as high as about 5.0 eV, and hence, electrons are not injected into the insulation film 30 from the gate electrode 41.

Figure 11:
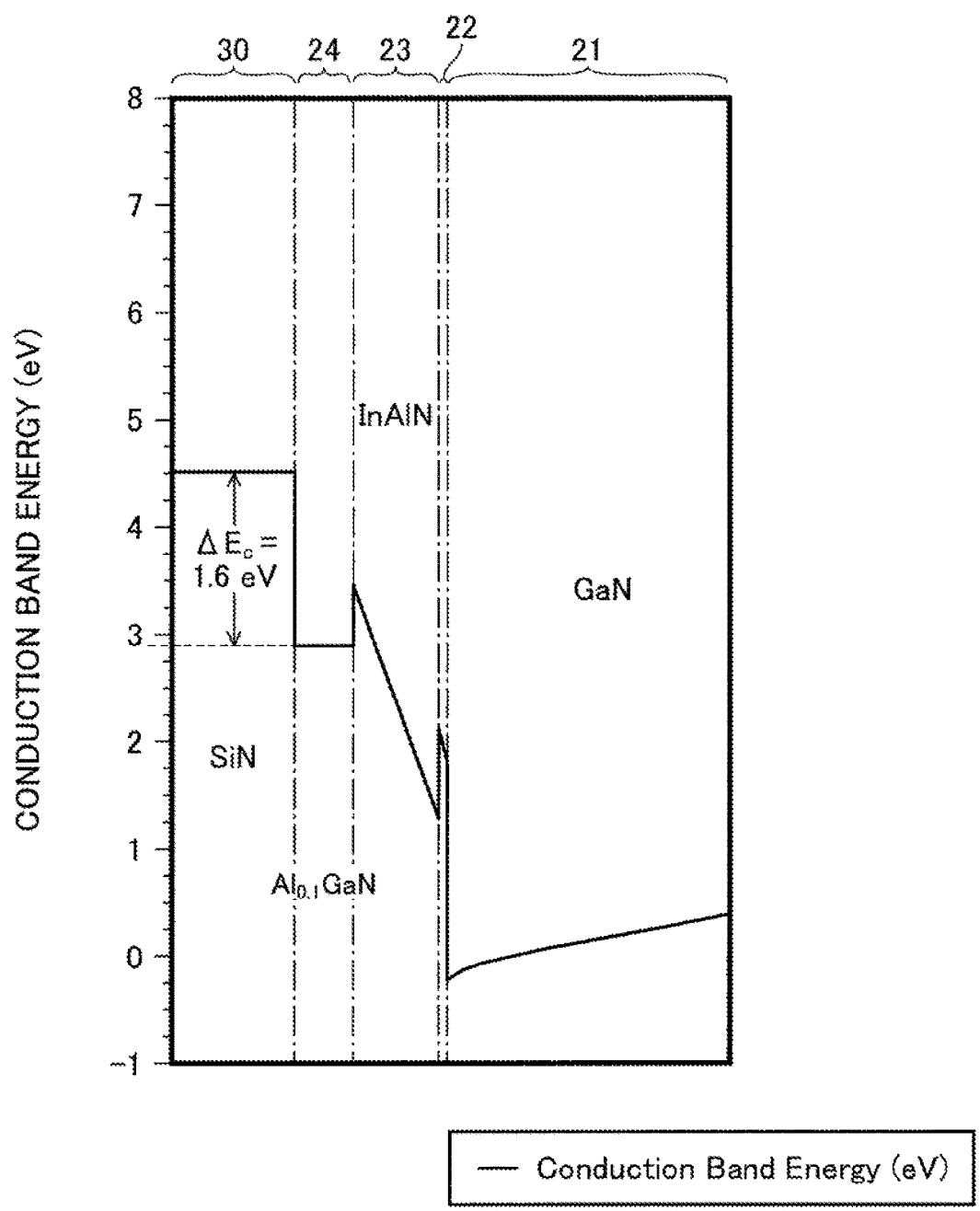
FIG. 11 is a third band diagram of a semiconductor apparatus in the direction perpendicular to the substrate surface according to the first embodiment.
Figure 12:
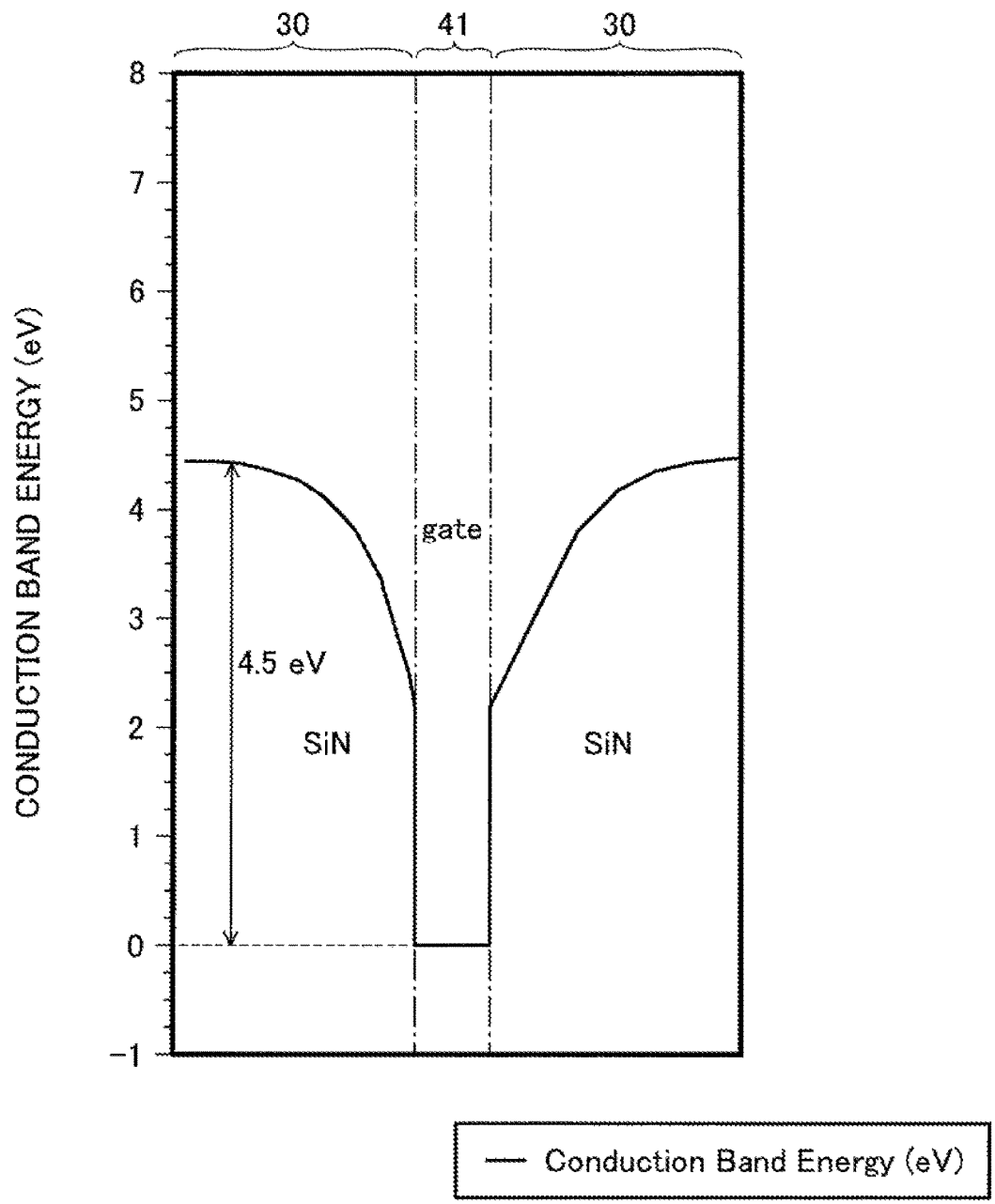
FIG. 12 is a third band diagram of a semiconductor apparatus in the direction along the substrate surface according to the first embodiment.

Also, FIG. 11 and FIG. 12 are band diagrams in a case where the cap layer 24 is formed of $Al_{0.1}Ga_{0.9}N$ in a semiconductor apparatus according to the embodiment. FIG. 11 is a band diagram in the direction perpendicular to the substrate surface, and FIG. 12 is a band diagram in the direction along the substrate surface, in the semiconductor apparatus having this structure.

As illustrated in FIG. 11, in the semiconductor apparatus having this structure, the difference ΔEc along the bottom of the conduction band between the cap layer 24 formed of $Al_{0.1}Ga_{0.9}N$ and the insulation film 30 formed of SiN, is about 1.6 eV. Therefore, the cap layer 24 formed between the insulation film 30 and the electron supply layer 23 forms a quantum well, which makes the barrier from the cap layer 24 to the insulation film 30 high. Consequently, even if a high voltage is applied to the drain electrode 43, electrons of the 2DEG 21a are not injected into the insulation film 30.

Also, as illustrated in FIG. 12, the bottom of the conduction band is raised because SiN forming the insulation film 30 is formed over the cap layer 24 formed of $Al_{0.1}Ga_{0.9}N$. Therefore, the difference $E_{c\_pass}$ between the Fermi level in the gate electrode 41 and the bottom of the conduction band of SiN forming the insulation film 30 becomes as high as about 4.5 eV, and hence, electrons are not injected into the insulation film 30 from the gate electrode 41.

Thus, even in a semiconductor apparatus in which the cap layer 24 is formed of GaN or $Al_{0.1}Ga_{0.9}N$, electrons are not injected into the insulation film 30, and hence, electrons are trapped in the insulation film 30. Therefore, the density of electrons of the 2DEG 21a is not reduced, and generation of current collapse is prevented.

In this way, in a semiconductor apparatus according to the embodiment, the cap layer 24 formed between the electron supply layer 23 and the insulation film 30 may be formed of any material that forms a quantum well. Note that if the cap layer 24 is formed of $Al_XGa_{1-X}N$, a quantum well is formed in the cap layer 24 between the electron supply layer 23 and the insulation film 30 as long as the value of X falls in a range greater than or equal to 0 and less than or equal to 0.4. Also, if the cap layer 24 is formed of $In_YGa_{1-Y}N$, a quantum well is formed in the cap layer 24 between the electron supply layer 23 and the insulation film 30 as long as the value of Y is greater than or equal to 0.05. In this case, however, it is preferable that the value of Y is less than or equal to 0.2 from the viewpoint of crystal growth.

(Method of Manufacturing Semiconductor Apparatus)

Next, a method of manufacturing a semiconductor apparatus according to the embodiment will be described based on FIG. 13A to FIG. 16C.

Figure 13A:
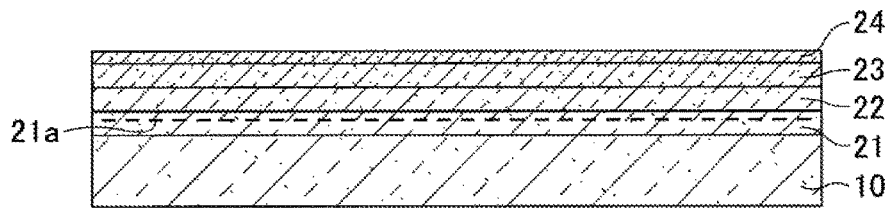
FIGS. 13A-13C are first process views of a method of manufacturing a semiconductor apparatus according to the first embodiment.

First, as illustrated in FIG. 13A, nitride semiconductor layers are formed over a substrate 10 by epitaxial growth using MOVPE (Metal Organic Vapor Phase Epitaxy). Specifically, a buffer layer (not illustrated), an electron transit layer 21, an intermediate layer 22, an electron supply layer 23, and a cap layer 24 are sequentially stacked and formed by nitride semiconductors on the substrate 10. The electron transit layer 21 is formed of i-GaN having the thickness about 3 μm, the intermediate layer 22 is formed of i-AlN having the thickness about 1 nm, and the electron supply layer 23 is formed of i-$In_{0.1}Al_{0.83}N$ having the thickness about 12 nm. The cap layer 24 is formed of InGaN having the thickness about 8 nm. With this structure, 2DEG 21a is generated in the neighborhood of the interface between the electron supply layer 22 and the electron transit layer 21 in the electron transit layer 21. Note that a semi-insulative SiC substrate is used for the substrate 10, and the buffer layer (not illustrated) is formed of GaN, AlGaN, or the like.

Figure 13B:
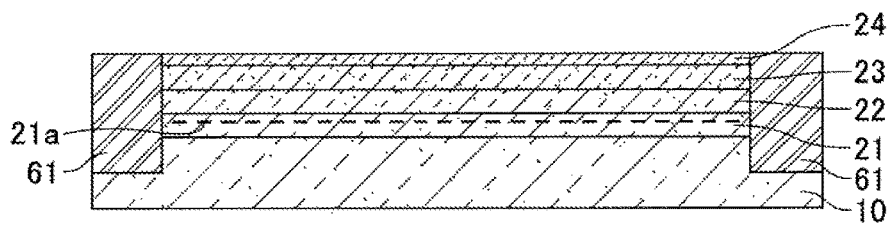

Next, as illustrated in FIG. 13B, element isolating regions 61 are formed in a part of the nitride semiconductor layers formed over the substrate 10, and the substrate 10. Specifically, by applying photoresist on the surface of the cap layer 24, which is then exposed by an exposure device and developed, a photoresist pattern (not illustrated) is formed that has openings in regions where the element isolating regions 61 are to be formed. After that, by applying ion implantation by ions of Ar or the like to the nitride semiconductor layers and the like at the openings of the photoresist pattern, the element isolating regions 61 are formed. Note that when forming the element isolating regions 61, ions of Ar or the like may be injected even into a part of the substrate 10. After that, the photoresist pattern (not illustrated) is removed by an organic solvent or the like.

Figure 13C:
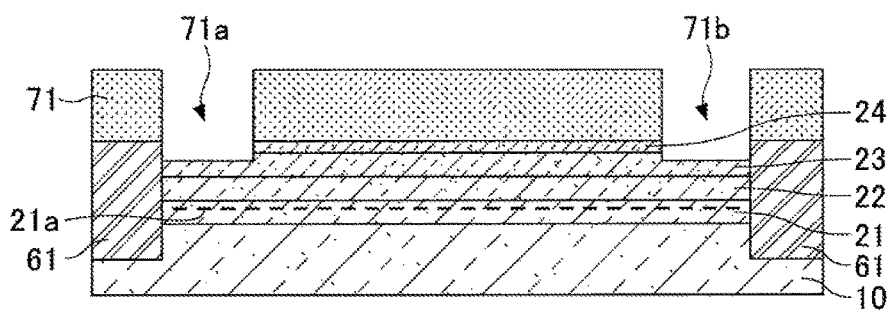

Next, as illustrated in FIG. 13C, a photoresist pattern 71 is formed that has openings in regions where a source electrode 42 and a drain electrode 43 are to be formed, over the cap layer 24. After that, parts of the surfaces of the cap layer 24 and the electron supply layer 23 are removed at the openings 71a and 71b in the photoresist pattern 71. Specifically, by applying photoresist on the surface of the cap layer 24, which is then exposed by an exposure device and developed, the photoresist pattern 71 is formed that has the openings 71a and 71b in regions where the source electrode 42 and the drain electrode 43 are to be formed. After that, parts of the surfaces of the cap layer 24 and the electron supply layer 23 are removed in the regions where the photoresist pattern is not formed, namely the regions exposed at the openings 71a and 71b in the photoresist pattern 71, by RIE (Reactive Ion Etching) or the like. Note that this etching may remove the nitride semiconductor layers until the surface of the electron supply layer 23 is exposed. Also, as the etching gas, gas including a chlorine component is used.

Figure 14A:
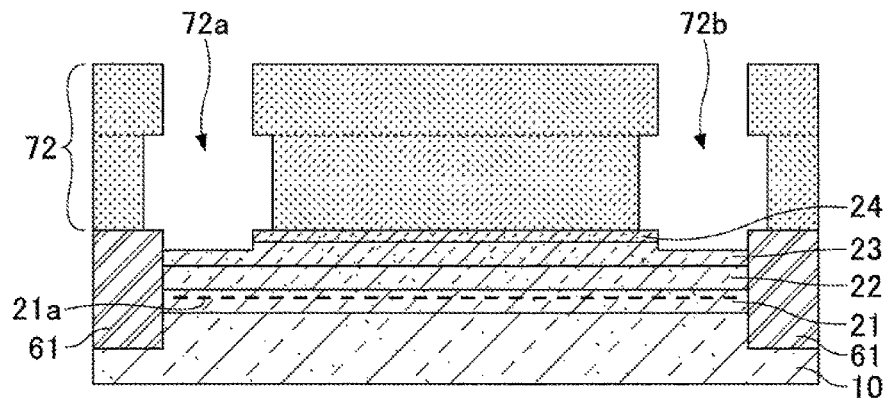
FIGS. 14A-14C are second process views of the method of manufacturing a semiconductor apparatus according to the first embodiment.

Next, as illustrated in FIG. 14A, the photoresist pattern 71 is removed by an organic solvent or the like, and then, a photoresist pattern 72 is formed that has openings 72a and 72b in regions where the source electrode 42 and the drain electrode 43 are to be formed. Specifically, the photoresist pattern 71 is removed by an organic solvent or the like, and then, the photoresist is applied again over the cap layer 24, which is then exposed by an exposure device and developed. Thus, the photoresist pattern 72 is formed that has the openings 72a and 72b in the regions where the source electrode 42 and the drain electrode 43 are to be formed. The photoresist pattern 72 may be formed by stacking two layers of photoresist layers as illustrated in the figure.

Figure 14B:
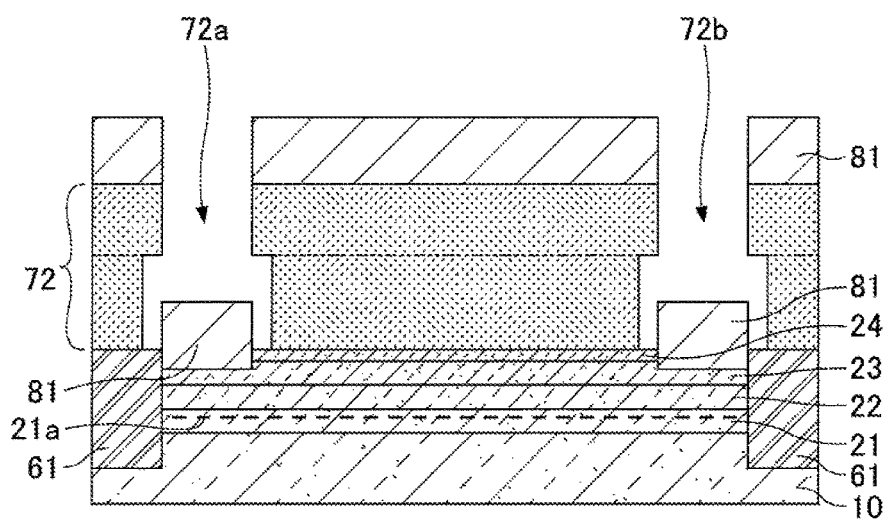

Next, as illustrated in FIG. 14B, over the surface where the photoresist pattern 72 has been formed, a multi-layer metal film 81 made of Ti/Al is formed by vacuum deposition. Specifically, a Ti film is formed by vacuum deposition over the surface where the photoresist pattern 72 has been formed, and an Al film is formed over the formed Ti film. According to the embodiment, the film thickness of the Ti film to be formed is about 20 nm, and the film thickness of the Al film is about 200 nm.

Figure 14C:
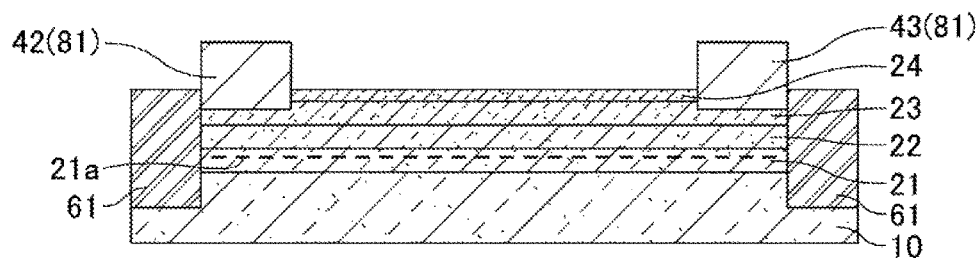

Next, as illustrated in FIG. 14C, by dipping into an organic solvent or the like, the multi-layer metal film 81 formed over the photoresist pattern 72 is removed by liftoff, along with the photoresist pattern 72. Thus, the source electrode 42 and the drain electrode 43 are formed with the remaining multi-layer metal film 81 at the openings 72a and 72b of the photoresist pattern 72. After that, heat treatment is applied at a temperature of 550° C. to establish ohmic contacts between the electron supply layer 23, and the source electrode 42 and the drain electrode 43.

Figure 15A:
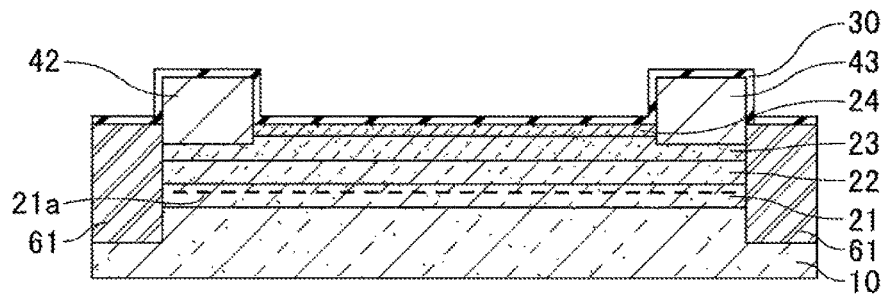
FIGS. 15A-15C are third process views of the method of manufacturing a semiconductor apparatus according to the first embodiment.

Next, as illustrated in FIG. 15A, the insulation film 30 as a passivation film is formed over the cap layer 24 and the like. Specifically, the insulation film 30 is formed by forming an SiN film having the thickness about 50 nm over the cap layer 24, by using plasma CVD (Chemical Vapor Deposition). When forming the insulation film 30 by plasma CVD, for example, silane, ammonia, or the like are used as a raw material gas. The formed insulation film 30 has the refractive index of 2.0 in the wavelength 633 nm, and is a stoichiometric film.

Figure 15B:
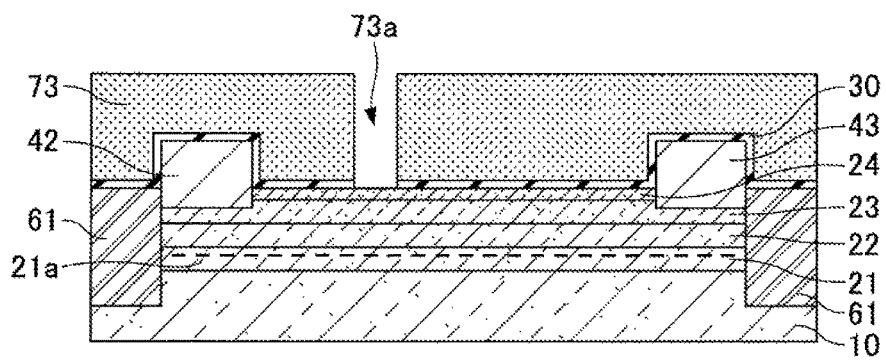

Next, as illustrated in FIG. 15B, a photoresist pattern 73 having an opening 73a is formed over the insulation film 30. Specifically, by applying photoresist over the insulation film 30, which is then exposed by an exposure device and developed, the photoresist pattern 73 is formed that has the opening 73a having the width of 0.1 µm.

Figure 15C:
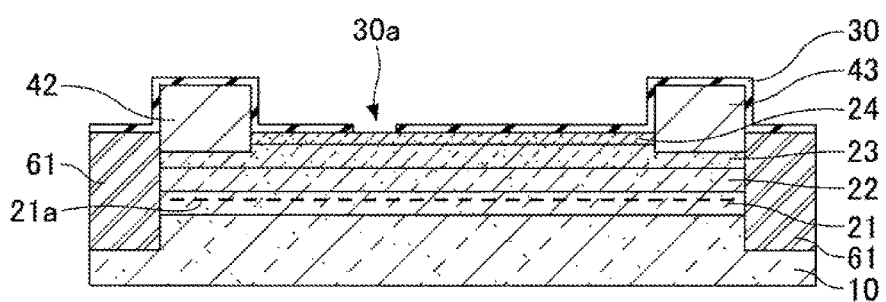

Next, as illustrated in FIG. 15C, the insulation film 30 in the opening 73a of the photoresist pattern 73 is removed by dry etching such as RIE or the like that uses $SF_6$ as etching gas. Thus, the insulation film 30 is formed having an opening 30a in the region where the gate electrode 41 is to be formed. After that, the photoresist pattern 73 is removed by an organic solvent or the like.

Figure 16A:
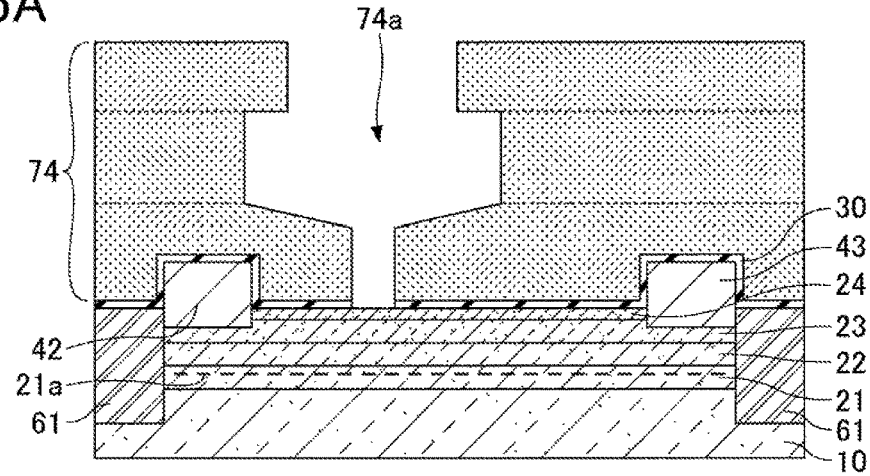
FIGS. 16A-16C are fourth process views of the method of manufacturing a semiconductor apparatus according to the first embodiment.

Next, as illustrated in FIG. 16A, a photoresist pattern 74 is formed to form the gate electrode 41 over the insulation film 30, including the opening 30a of the insulation film 30. This photoresist pattern 74 is formed of stacked three layers of electron beam resist layers, and has an opening 74a in a region where the gate electrode 41 is to be formed, namely, in the opening 30a of the insulation film 30. Specifically, by repeating application of electron beam resist over the cap layer 24 and the insulation film 30, three layers of electron beam resist layers are formed, and then, by repeating drawing by an electron beam drawing device and development, the opening 74a is formed in the three layers of electron beam resist layers. Thus, the photoresist pattern 74 having the opening 74a is formed. The opening 74a in the photoresist pattern 74 is formed to have the widths of 0.8 µm, 1.3 µm, and 0.15 µm at the three layers of electron beam resist layers, respectively, in order from the top.

Figure 16B:
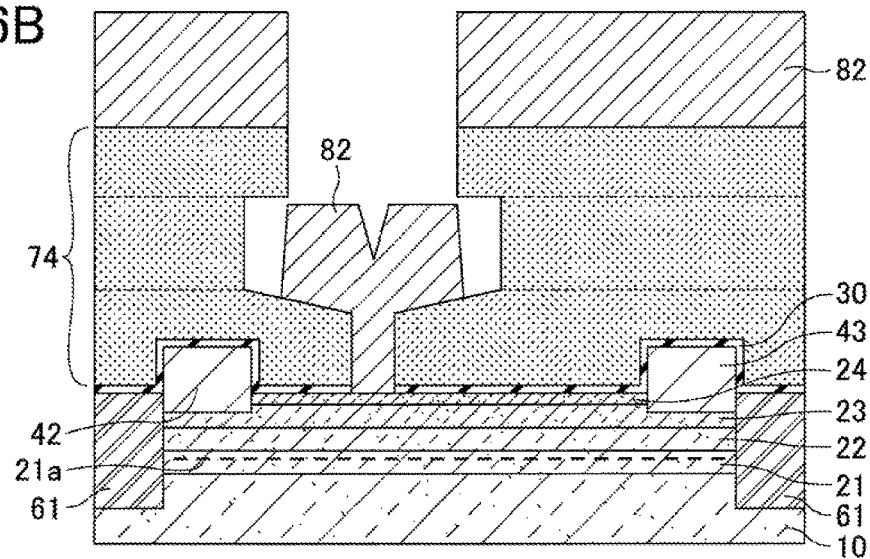

Next, as illustrated in FIG. 16B, over the surface where the photoresist pattern 74 is formed, a multi-layer metal film 82 made of Ni/Au is formed by vacuum deposition. Specifically, an Ni film is formed by vacuum deposition over the surface where the photoresist pattern 74 has been formed, and an Au film is formed over the formed Ni film. According to the embodiment, the film thickness of the Ni film to be formed is about 10 nm, and the film thickness of the Al film is about 300 nm.

Figure 16C:
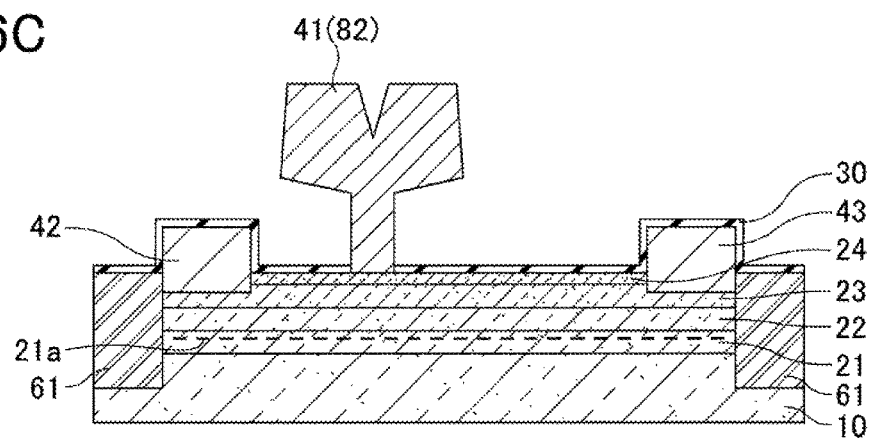

Next, as illustrated in FIG. 16C, by dipping into an organic solvent or the like, the multi-layer metal film 82 formed over the photoresist pattern 74 is removed by liftoff, along with the photoresist pattern 74. Thus, the gate electrode 41 is formed with the remaining multi-layer metal film 82 at the opening 74a of the photoresist pattern 74.

By the process described above, the semiconductor apparatus according to the embodiment can be manufactured.

Second Embodiment (Semiconductor Apparatus)

Figure 17:
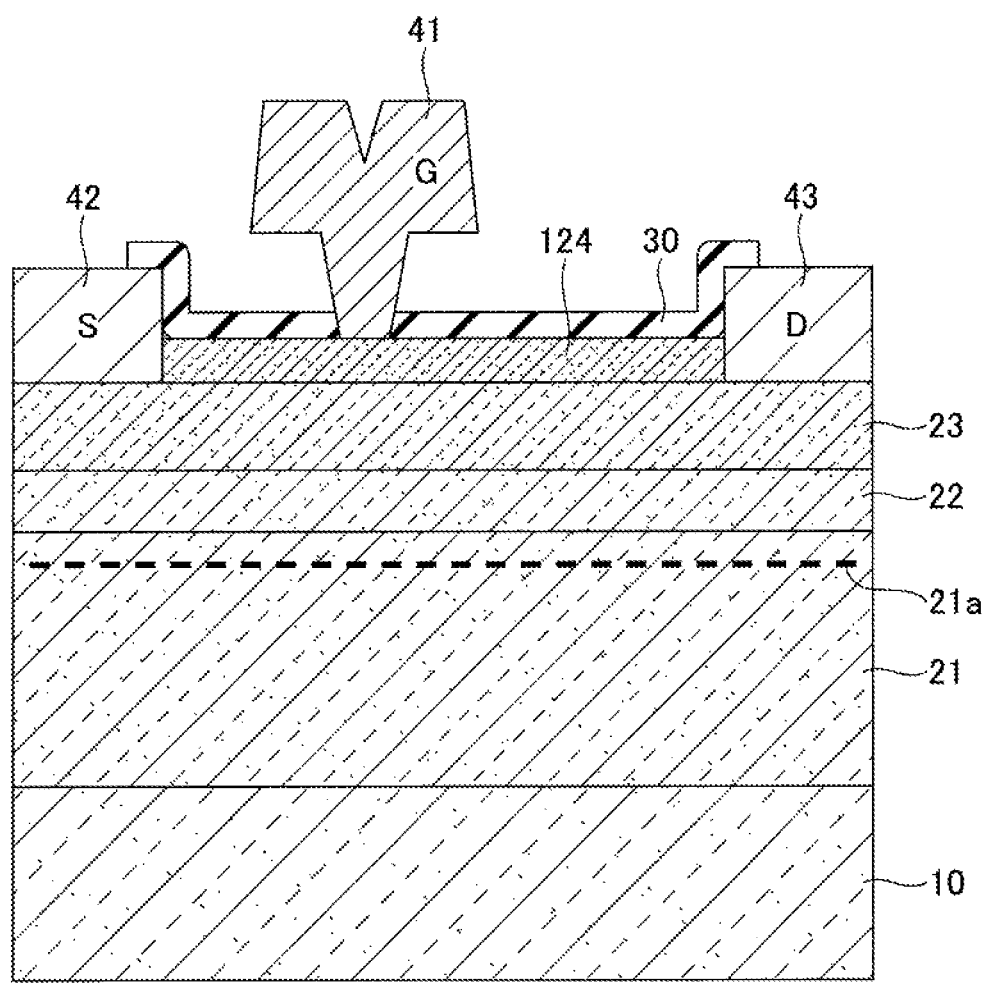
FIG. 17 is a structural diagram of a semiconductor apparatus according to a second embodiment.

Next, a semiconductor apparatus according to a second embodiment will be described based on FIG. 17. As illustrated in FIG. 17, the semiconductor apparatus according to the embodiment has a buffer layer (not illustrated), an electron transit layer 21, an intermediate layer 22, an electron supply layer 23, and a cap layer 124, stacked over a substrate 10. According to the embodiment, the electron transit layer 21 is formed of i-GaN, the intermediate layer 22 is formed of AlN, the electron supply layer 23 is formed of InAlN, and the cap layer 124 is formed of MgO. This structure generates 2DEG 21a in the electron transit layer 21 in the neighborhood of the interface between the electron transit layer 21 and the intermediate layer 22. Note that the substrate 10 is formed of a semi-insulative SiC substrate. A gate electrode 41 is formed over the cap layer 124, and a source electrode 42 and a drain electrode 43 are formed over the electron supply layer 23. A region over the cap layer 124 where the gate electrode 41 is not formed, has an insulation film 30 of SiN or the like formed as a passivation film. The cap layer 124 is formed of a material that has a wider band gap than a material of the electron supply layer 23, and may be formed of BeS, BeSe, or the like, but MgO is preferable. Note that the source electrode 42 and the drain electrode 43 may be formed over the electron transit layer 21.

Figure 18:
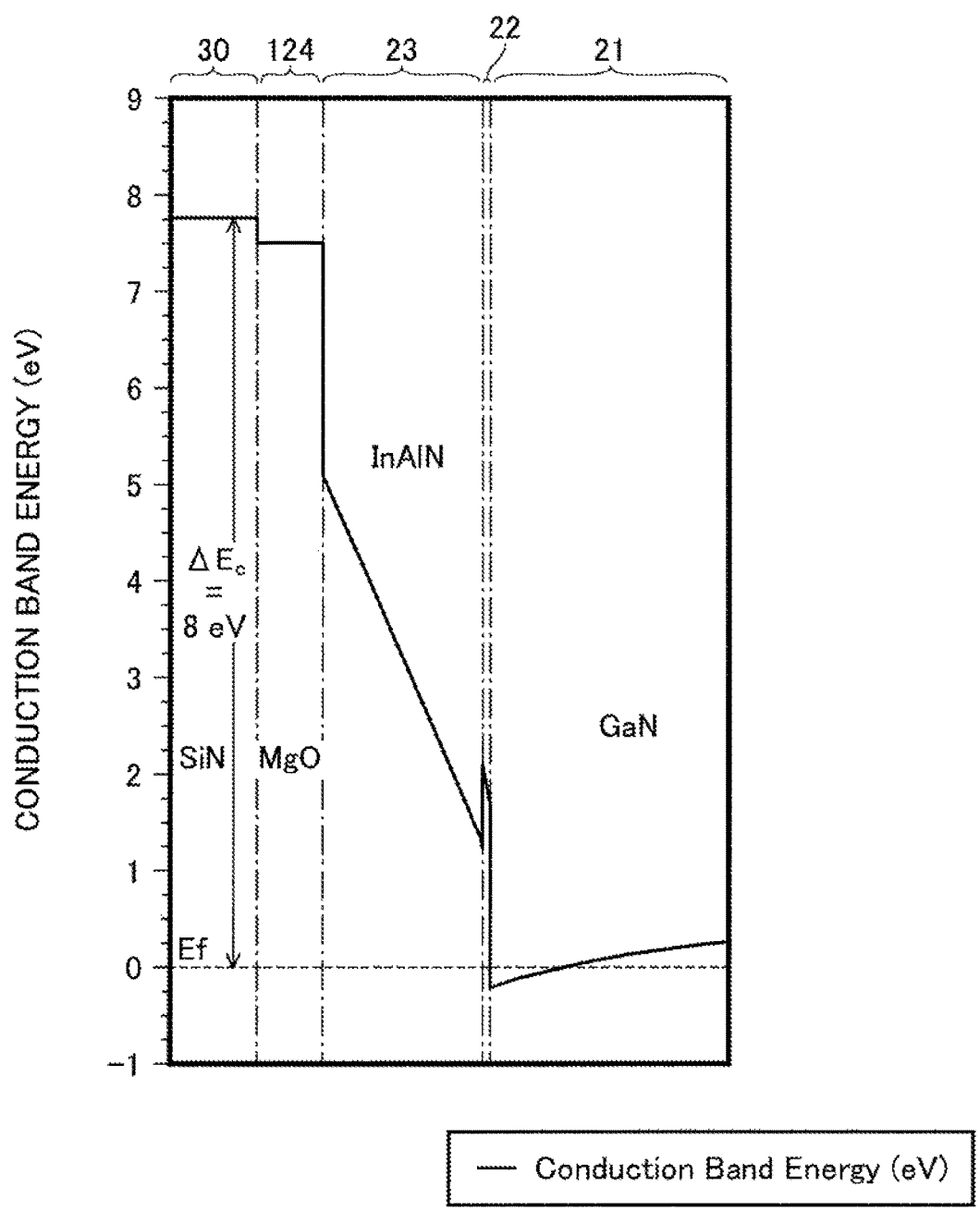
FIG. 18 is a first band diagram of a semiconductor apparatus in the direction perpendicular to the substrate surface according to the second embodiment.

Band structures of the semiconductor apparatus according to the embodiment will be described based on FIG. 18 to FIG. 20. FIG. 18 is a band diagram of the semiconductor apparatus in the direction perpendicular to the substrate surface, and FIG. 19 is a band diagram of the semiconductor apparatus in the direction along the substrate surface, according to the embodiment.

As illustrated in FIG. 18, the semiconductor apparatus according to the embodiment, the difference ΔEc along the bottom of the conduction band between the electron transit layer 21 formed of i-GaN and the insulation film 30 formed of SiN, is about 8.0 eV. Therefore, even if a high voltage is applied to the drain electrode 43, electrons of the 2DEG 21a are not injected into the insulation film 30 because the barrier from the electron transit layer 21 to the insulation film 30 is high.

In the semiconductor apparatus according to the embodiment, although the electron supply layer 23 formed of InAlN has the film thickness about 20 nm, if the film thickness of the electron supply layer 23 is thin, 2DEG 21a is not generated in the electron transit layer 21, and hence, the semiconductor apparatus does not function as a HEMT. For example, as illustrated in FIG. 20, if the film thickness of the electron supply layer 23 formed of InAlN is about 12 µm, 2DEG 21a is not generated in the electron transit layer 21, and hence, the semiconductor apparatus does not function as a HEMT. Therefore, in the semiconductor apparatus according to the embodiment, it is preferable that the film thickness of the electron supply layer 23 is greater than or equal to 20 nm. Note that if the film thickness of the electron supply layer 23 is too thick, the high frequency characteristic is reduced, which is not preferable.

Figure 19:
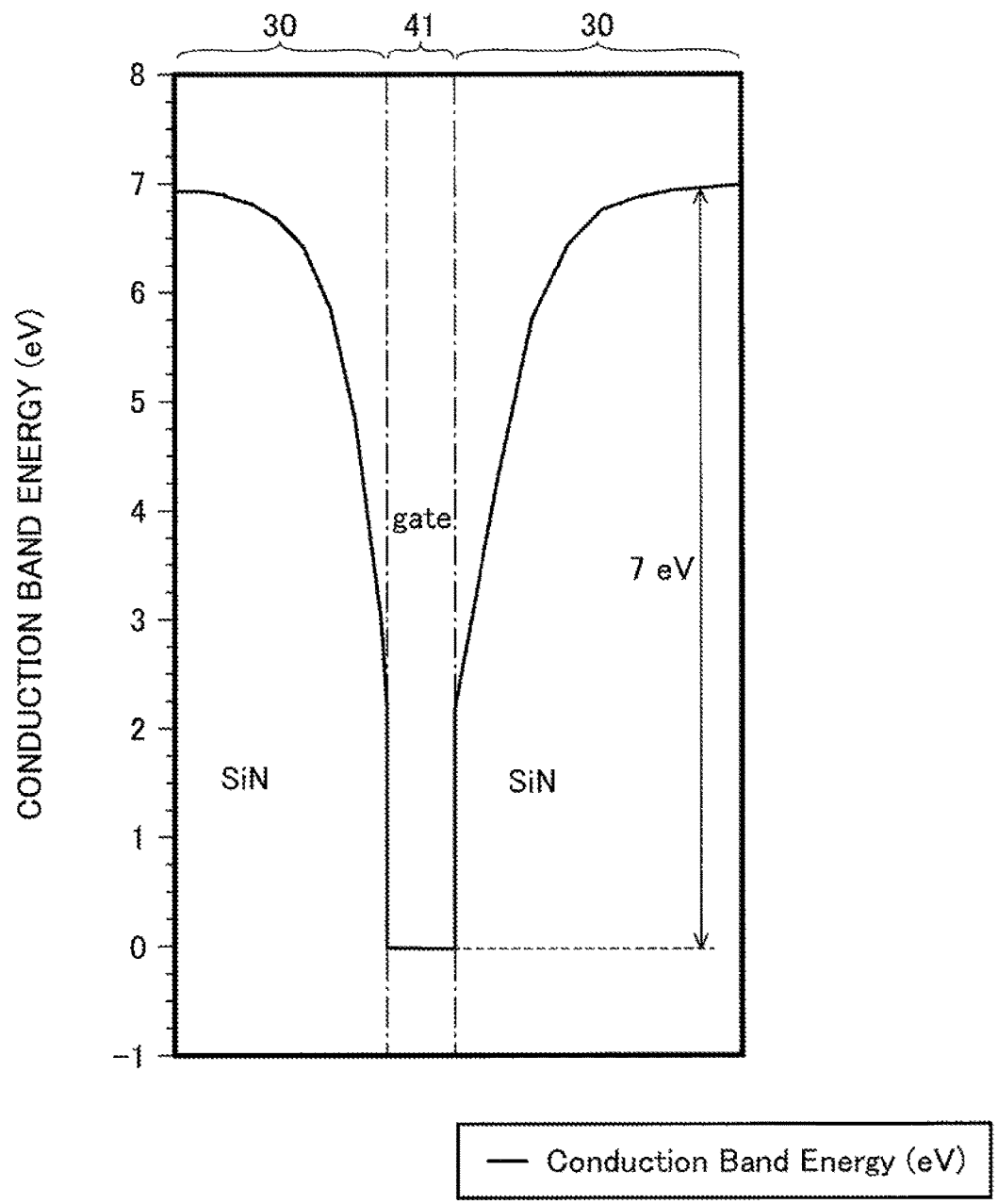
FIG. 19 is a band diagram of a semiconductor apparatus in the direction along the substrate surface according to the second embodiment.
Figure 20:
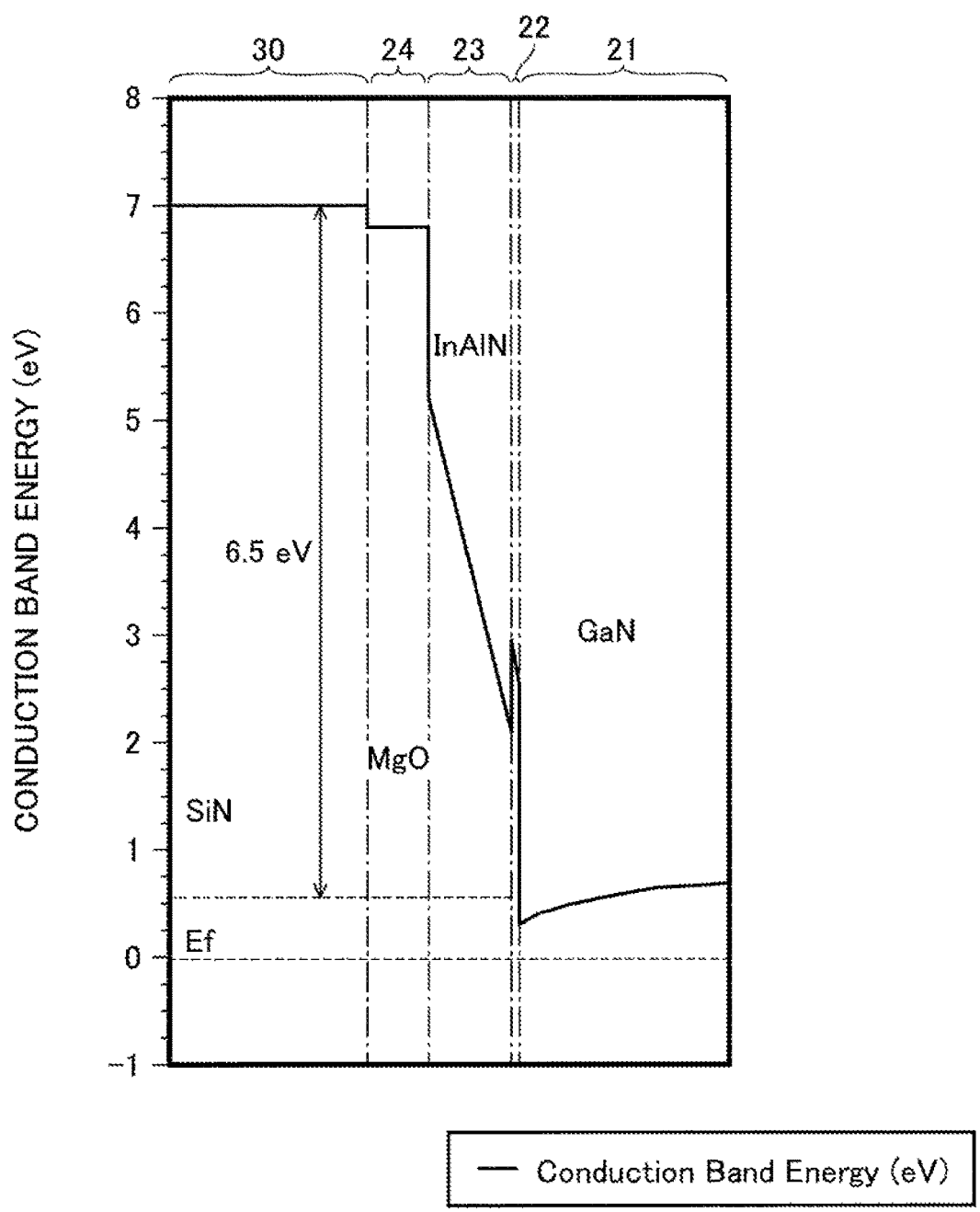
FIG. 20 is a second band diagram of a semiconductor apparatus in the direction perpendicular to the substrate surface according to the second embodiment.

Also, as illustrated in FIG. 19, the bottom of the conduction band is raised because SiN forming the insulation film 30 is formed over the cap layer 124 formed of MgO. Therefore, the difference $E_{c\_pass}$ between the Fermi level in the gate electrode 41 and the bottom of the conduction band of SiN forming the insulation film 30 becomes as high as about 7.0 eV, and hence, electrons are not injected into the insulation film 30 from the gate electrode 41.

Therefore, in the semiconductor apparatus according to the embodiment, even if a high voltage is applied to the drain electrode 43, electrons are not injected into the insulation film 30, and hence, electrons are trapped in the insulation film 30. Therefore, the density of electrons of the 2DEG 21a is not reduced, and generation of current collapse is prevented.

(Characteristic of Current Collapse)

Figure 21:
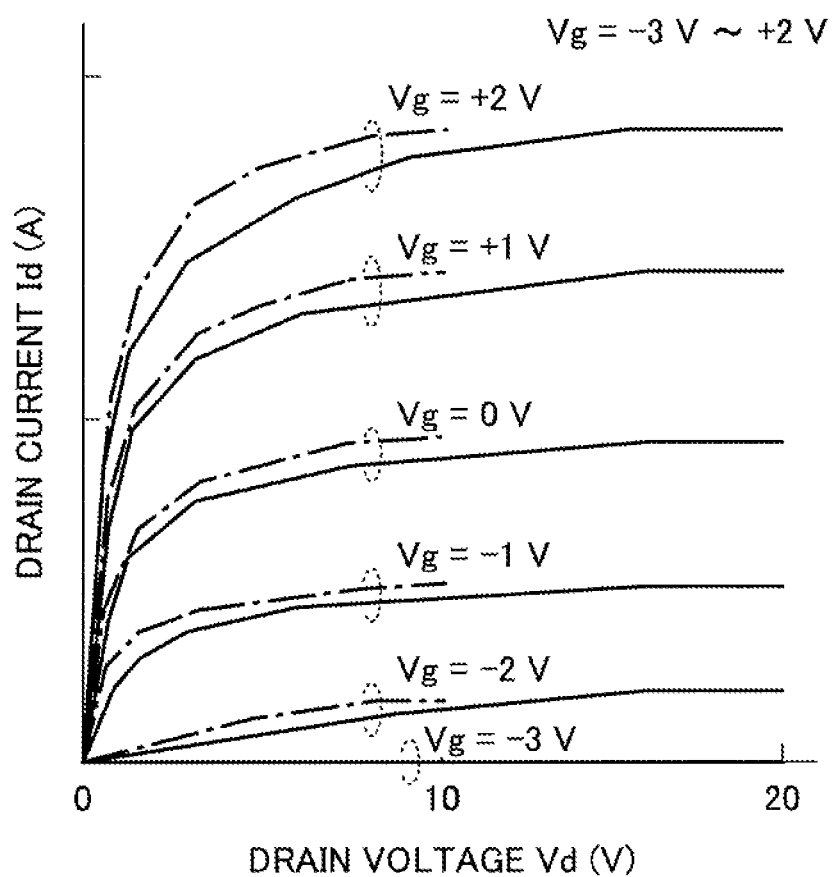
FIG. 21 is a correlation diagram of the drain voltage and the drain current of a semiconductor apparatus according to the second embodiment.

Next, a characteristic of current collapse in the semiconductor apparatus according to the embodiment will be described. FIG. 21 illustrates a relationship between the drain voltage Vd and the drain current Id in a semiconductor apparatus having the structure illustrated in FIG. 17, in cases where the source voltage is set to 0 V, and the gate voltage Vg is changed to make the drain voltage rise up to 10 V, and up to 20 V. Note that FIG. 21 illustrates cases where the gate voltage Vg is changed to be −3, −2, −1, 0, +1, and +2 V.

As illustrated in FIG. 7, in the semiconductor apparatus having the structure illustrated in FIG. 1, the drain current Id is remarkably reduced in the cases where the drain voltage Vd has risen up to 20 V, compared to the cases where the drain voltage Vd has risen up to 10 V, and thus, current collapse is generated. On the other hand, as illustrated in FIG. 21, in the semiconductor apparatus having the structure illustrated in FIG. 17, the drain current Id is not reduced much in the cases where the drain voltage Vd has risen up to 20 V, compared to the cases where the drain voltage Vd has risen up to 10 V, and hence, current collapse is prevented. Therefore, the on-current is not reduced much, and the on-resistance does not become high as much.

(Method of Manufacturing Semiconductor Apparatus)

Next, a method of manufacturing a semiconductor apparatus according to the embodiment will be described based on FIG. 22A to FIG. 25C.

Figure 22A:
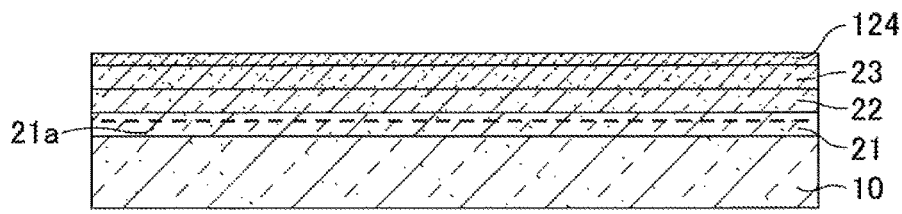
FIGS. 22A-22C are first process views of a method of manufacturing a semiconductor apparatus according to the second embodiment.

First, as illustrated in FIG. 22A, a buffer layer (not illustrated), an electron transit layer 21, an intermediate layer 22, an electron supply layer 23, and a cap layer 124 are sequentially stacked and formed over a substrate 10 by epitaxial growth using MOVPE. Note that in the embodiment, the buffer layer (not illustrated), the electron transit layer 21, the intermediate layer 22, and the electron supply layer 23 may be referred to as the "nitride semiconductor layers". The electron transit layer 21 is formed of i-GaN having the thickness about 3 μm, the intermediate layer 22 is formed of i-AlN having the thickness about 1 nm, and the electron supply layer 23 is formed of i-In$_{0.17}$Al$_{0.83}$N having the thickness about 20 nm. The cap layer 124 is formed of MgO having the thickness about 8 nm. This structure generates 2DEG 21a in the electron transit layer 21 in the neighborhood of the interface between the electron transit layer 21 and the intermediate layer 22. Note that a semi-insulative SiC substrate is used for the substrate 10, and the buffer layer (not illustrated) is formed of GaN, AlGaN, or the like.

Figure 22B:
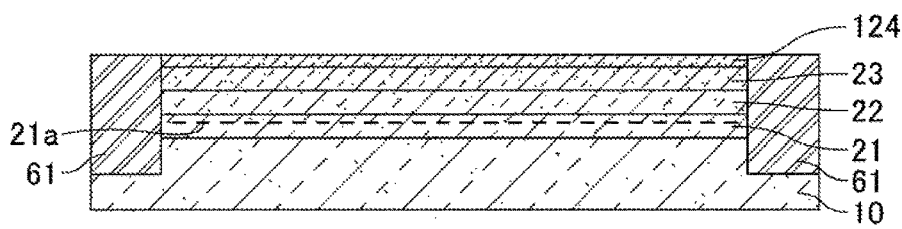

Next, as illustrated in FIG. 22B, element isolating regions 61 are formed in a part of the nitride semiconductor layers and the cap layer 124 formed over the substrate 10, and the substrate 10. Specifically, by applying photoresist on the surface of the cap layer 124, which is then exposed by an exposure device and developed, a photoresist pattern (not illustrated) is formed that has openings in regions where the element isolating regions 61 are to be formed. After that, by applying ion implantation by ions of Ar or the like to the nitride semiconductor layers and the like at the openings of the photoresist pattern, the element isolating regions 61 are formed. Note that when forming the element isolating regions 61, ions of Ar or the like may be injected even into a part of the substrate 10. After that, the photoresist pattern (not illustrated) is removed by an organic solvent or the like.

Figure 22C:
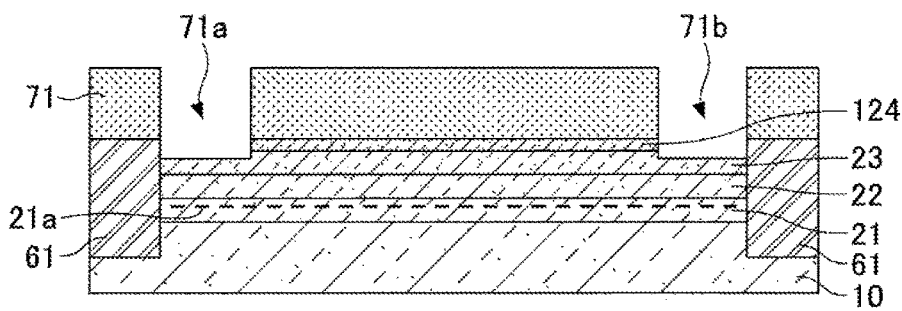

Next, as illustrated in FIG. 22C, a photoresist pattern 71 is formed that has openings in regions where a source electrode 42 and a drain electrode 43 are to be formed, over the cap layer 124. After that, a part of the surfaces of the cap layer 124 and the electron supply layer 23 are removed at the openings 71a and 71b in the photoresist pattern 71. Specifically, by applying photoresist on the surface of the cap layer 124, which is then exposed by an exposure device and developed, the photoresist pattern 71 is formed that has the openings 71a and 71b in the regions where the source electrode 42 and the drain electrode 43 are to be formed. After that, parts of the surfaces of the cap layer 124 and the electron supply layer 23 are removed in the regions where the photoresist pattern is not formed, namely the regions exposed at the openings 71a and 71b in the photoresist pattern 71, by RIE or the like. Note that this etching may remove the nitride semiconductor layers until the surface of the electron supply layer 23 is exposed. Also, a phosphoric acid solvent, an etchant including a chlorine component, or the like may be used for the etching.

Figure 23A:
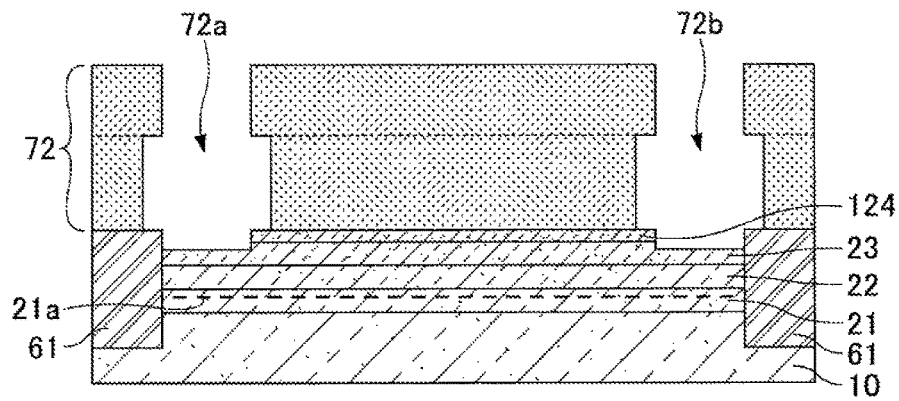
FIGS. 23A-23C are second process views of the method of manufacturing a semiconductor apparatus according to the second embodiment.

Next, as illustrated in FIG. 23A, the photoresist pattern 71 is removed by an organic solvent or the like, and then, a photoresist pattern 72 is formed that has openings 72a and 72b in regions where the source electrode 42 and the drain electrode 43 are to be formed. Specifically, the photoresist pattern 71 is removed by an organic solvent or the like, and then, the photoresist is applied again over the cap layer 124, which is then exposed by an exposure device and developed. Thus, the photoresist pattern 72 is formed that has the openings 72a and 72b in the regions where the source electrode 42 and the drain electrode 43 are to be formed. The photoresist pattern 72 may be formed by stacking two layers of photoresist layers as illustrated in the figure.

Figure 23B:
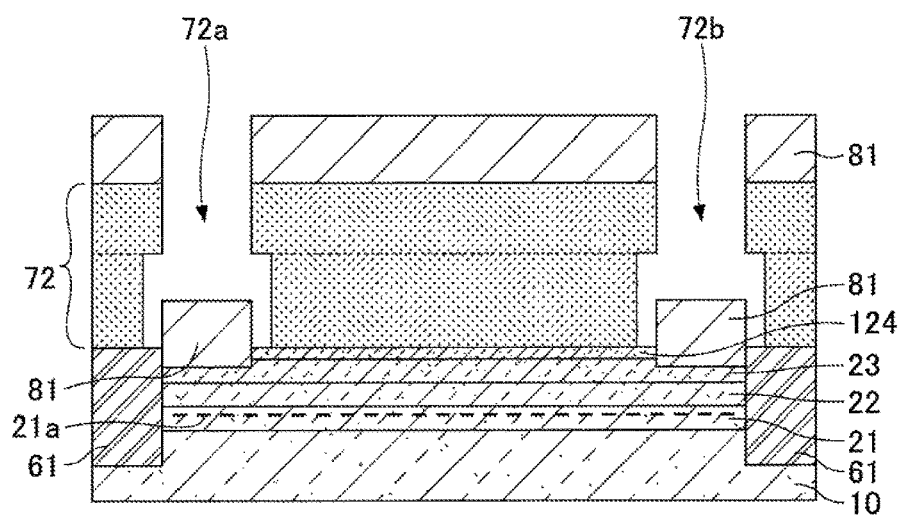

Next, as illustrated in FIG. 23B, over the surface where the photoresist pattern 72 has been formed, a multi-layer metal film 81 made of Ti/Al is formed by vacuum deposition. Specifically, a Ti film is formed by vacuum deposition over the surface where the photoresist pattern 72 has been formed, and an Al film is formed over the formed Ti film. According to the embodiment, the film thickness of the Ti film to be formed is about 20 nm, and the film thickness of the Al film is about 200 nm.

Figure 23C:
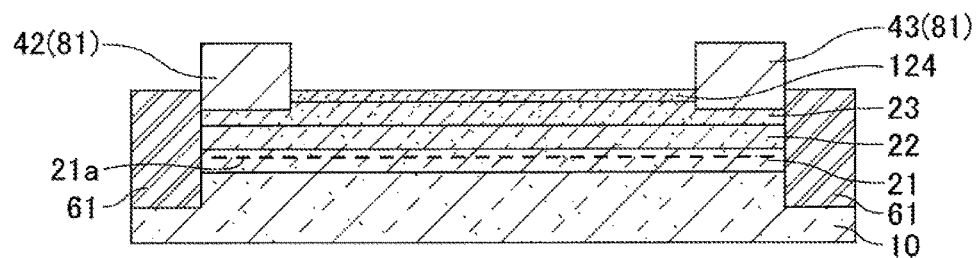

Next, as illustrated in FIG. 23C, by dipping into an organic solvent or the like, the multi-layer metal film 81 formed over the photoresist pattern 72 is removed by liftoff, along with the photoresist pattern 72. Thus, the source electrode 42 and the drain electrode 43 are formed with the remaining multi-layer metal film 81 at the openings 72a and 72b of the photoresist pattern 72. After that, heat treatment is applied at a temperature of 550° C. to establish ohmic contacts between the electron supply layer 23, and the source electrode 42 and the drain electrode 43.

Figure 24A:
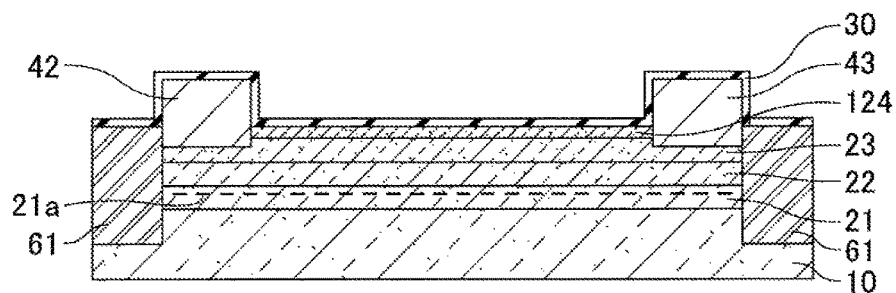
FIGS. 24A-24C are third process views of the method of manufacturing a semiconductor apparatus according to the second embodiment.

Next, as illustrated in FIG. 24A, the insulation film 30 as a passivation film is formed over the cap layer 124 and the like. Specifically, the insulation film 30 is formed by forming an SiN film having the thickness about 50 nm over the cap layer 124, by using plasma CVD. When forming the insulation film 30 by plasma CVD, for example, silane, ammonia, or the like are used as a raw material gas. The formed insulation film 30 has the refractive index of 2.0 in the wavelength 633 nm, and is a stoichiometric film.

Figure 24B:
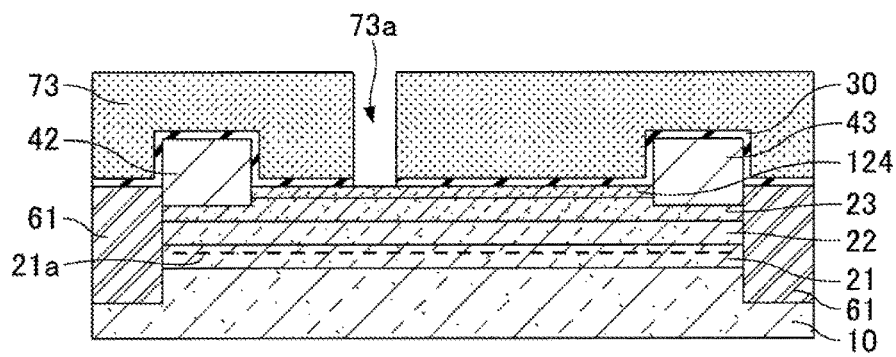

Next, as illustrated in FIG. 24B, a photoresist pattern 73 having an opening 73a is formed over the insulation film 30. Specifically, by applying photoresist over the insulation film 30, which is then exposed by an exposure device and developed, the photoresist pattern 73 is formed that has the opening 73a having the width of 0.1 μm.

Figure 24C:
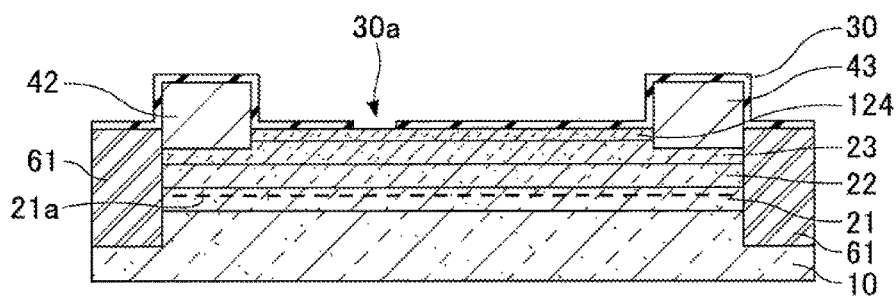

Next, as illustrated in FIG. 24C, the insulation film 30 in the opening 73a of the photoresist pattern 73 is removed by dry etching such as RIE or the like that uses SF$_6$ as etching gas. Thus, the insulation film 30 is formed having the opening 30a in a region where a gate electrode 41 is to be formed. After that, the photoresist pattern 73 is removed by an organic solvent or the like.

Figure 25A:
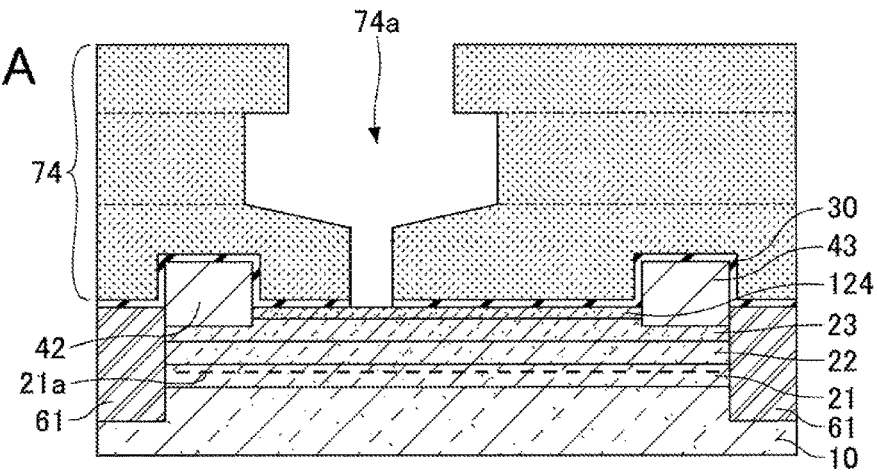
FIGS. 25A-25C are fourth process views of the method of manufacturing a semiconductor apparatus according to the second embodiment.

Next, as illustrated in FIG. 25A, a photoresist pattern 74 is formed to form the gate electrode 41 over the insulation film 30, including an opening 30a of the insulation film 30. This photoresist pattern 74 is formed of stacked three layers of electron beam resist layers, and has an opening 74a in a region where the gate electrode 41 is to be formed, namely, in the opening 30a of the insulation film 30. Specifically, by repeating application of electron beam resist over the cap layer 124 and the insulation film 30, three layers of electron beam resist layers are formed, and then, by repeating drawing by an electron beam drawing device and development, the opening 74a is formed in the three layers of electron beam resist layers. Thus, the photoresist pattern 74 having the opening 74a is formed. The opening 74a in the photoresist pattern 74 is formed to have the widths of 0.8 μm, 1.3 μm, and 0.15 μm at the three layers of electron beam resist layers, respectively, in order from the top.

Figure 25B:
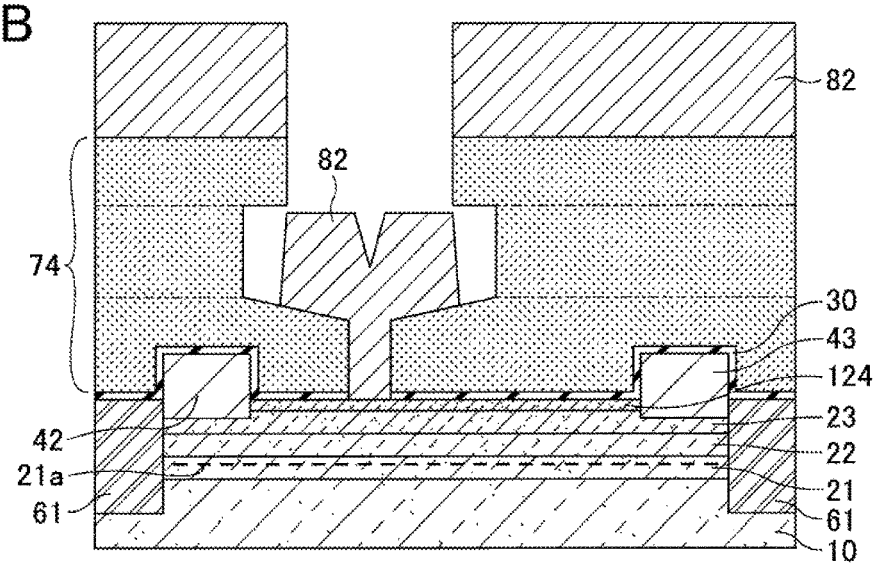

Next, as illustrated in FIG. 25B, over the surface where the photoresist pattern 74 is formed, a multi-layer metal film 82 made of Ni/Au is formed by vacuum deposition. Specifically, an Ni film is formed by vacuum deposition over the surface where the photoresist pattern 74 has been formed, and an Au film is formed over the formed Ni film. According to the embodiment, the film thickness of the Ni film to be formed is about 10 nm, and the film thickness of the Al film is about 300 nm.

Figure 25C:
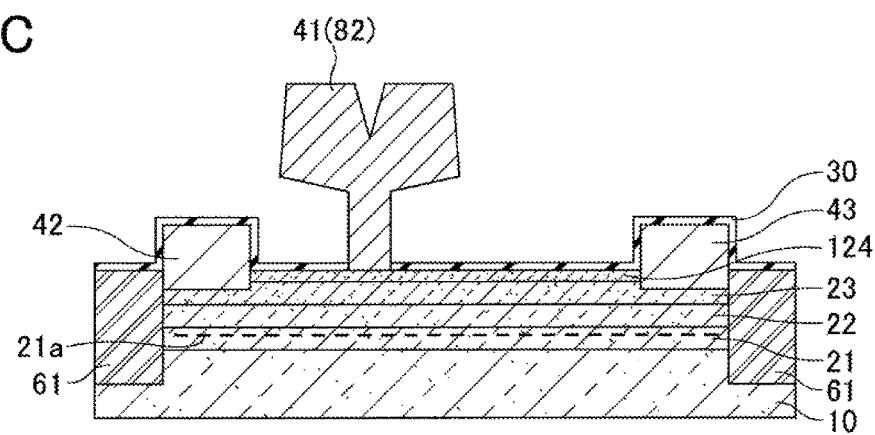

Next, as illustrated in FIG. 25C, by dipping into an organic solvent or the like, the multi-layer metal film 82 formed over the photoresist pattern 74 is removed by liftoff, along with the photoresist pattern 74. Thus, the gate electrode 41 is formed with the remaining multi-layer metal film 82 at the opening 74a of the photoresist pattern 74.

By the process described above, the semiconductor apparatus according to the embodiment can be manufactured.

Note that contents other than the above are substantially the same as in the first embodiment.

Figure 26:
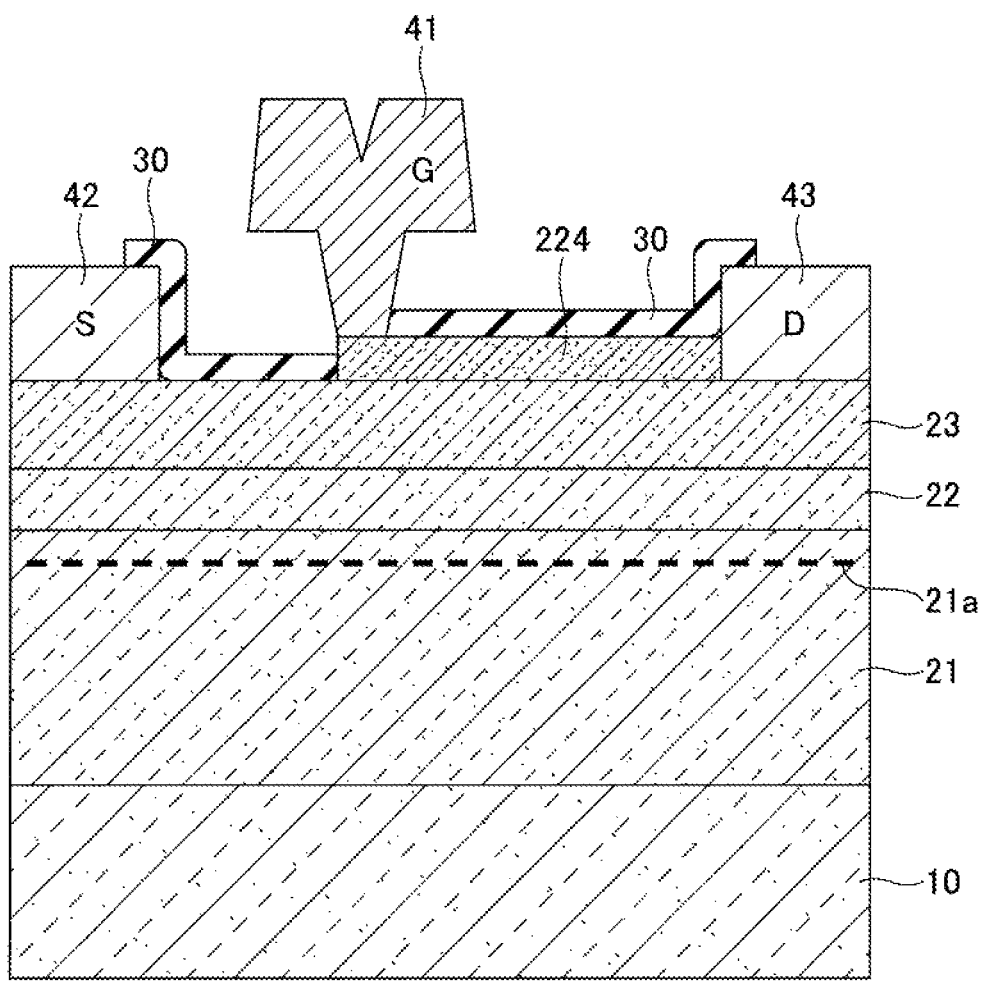
FIG. 26 is a structural diagram of a semiconductor apparatus according to a third embodiment.

Third Embodiment (Semiconductor apparatus) Next, a semiconductor apparatus according to a third embodiment will be described based on FIG. 26. As illustrated in FIG. 26, the semiconductor apparatus according to the embodiment has a buffer layer (not illustrated), an electron transit layer 21, an intermediate layer 22, an electron supply layer 23, and a cap layer 224, stacked over a substrate 10. According to the embodiment, the electron transit layer 21 is formed of i-GaN, the intermediate layer 22 is formed of AlN, the electron supply layer 23 is formed of InAlN, and the cap layer 224 is formed of MgO. This structure generates 2DEG 21a in the electron transit layer 21 in the neighborhood of the interface between the electron transit layer 21 and the intermediate layer 22.

According to the embodiment, the cap layer 224 is formed in a region immediately below a gate electrode 41, and between the gate electrode 41 and a drain electrode 43, not formed between the gate electrode 41 and a source electrode 42. Note that the substrate 10 is formed of a semi-insulative SiC substrate. The gate electrode 41 is formed over the cap layer 224, and the source electrode 42 and the drain electrode 43 are formed over the electron supply layer 23. Also, over the cap layer 224 between the gate electrode 41 and the drain electrode 43, and over the electron supply layer 23 between the gate electrode 41 and the source electrode 42, an insulation film 30 of SiN or the like is formed as a passivation film. The cap layer 224 is formed of a material that has a wider band gap than a material of the electron supply layer 23, and may be formed of BeS, BeSe, or the like, but MgO is preferable.

Figure 27:
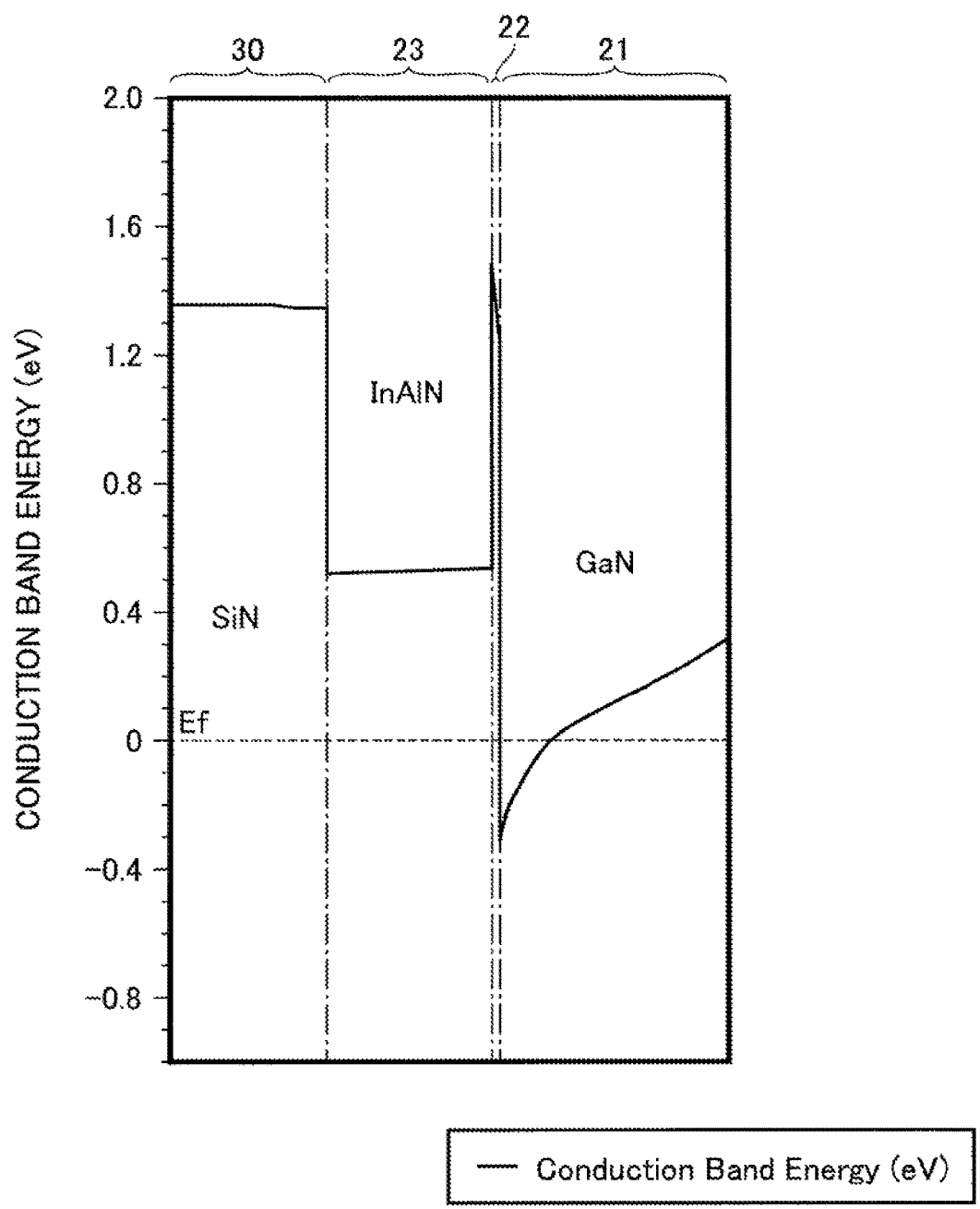
FIG. 27 is a first band diagram of a semiconductor apparatus in the direction perpendicular to the substrate surface according to the third embodiment.

Band structures of the semiconductor apparatus according to the embodiment will be described based on FIG. 27 and FIG. 28. FIG. 27 is a band diagram between the gate electrode 41 and the source electrode 42 in the direction perpendicular to the substrate surface, and FIG. 28 is a band diagram between the gate electrode 41 and the drain electrode 43 in the direction along the substrate surface, in the semiconductor apparatus according to the embodiment.

As illustrated in FIG. 27, since the cap layer 224 of MgO or the like is not formed between the gate electrode 41 and the source electrode 42, the density of the 2DEG 21a generated in the electron transit layer 21 can be increased. Note that since a voltage applied between the gate electrode 41 and the source electrode 42 is low, electrons are hardly trapped in the insulation film between the gate electrode 41 and the source electrode 42.

Figure 28:
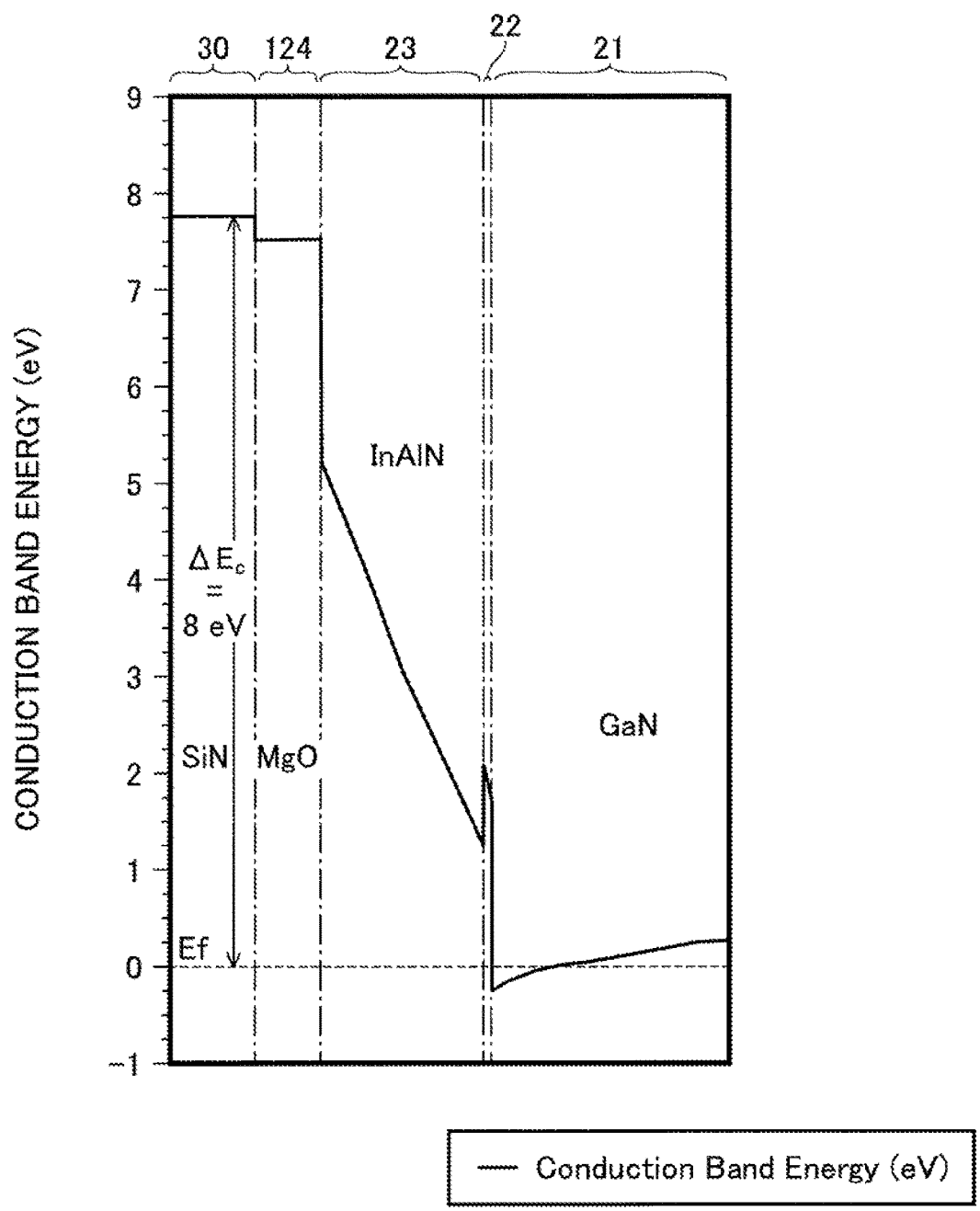
FIG. 28 is a second band diagram of a semiconductor apparatus in the direction perpendicular to the substrate surface according to the third embodiment.

On the other hand, as illustrated in FIG. 28, the cap layer 224 of MgO or the like is formed between the gate electrode 41 and the drain electrode 43. Therefore, the difference ΔEc along the bottom of the conduction band between the electron transit layer 21 formed of i-GaN and the insulation film 30 formed of SiN, is about 8.0 eV. Therefore, even if a high voltage is applied to the drain electrode 43, electrons of the 2DEG 21a are not injected into the insulation film 30 because the barrier from the electron transit layer 21 to the insulation film 30 is high.

Therefore, in the semiconductor apparatus according to the embodiment, the on-resistance can be further lowered.

(Characteristic of Current Collapse)

Figure 29:
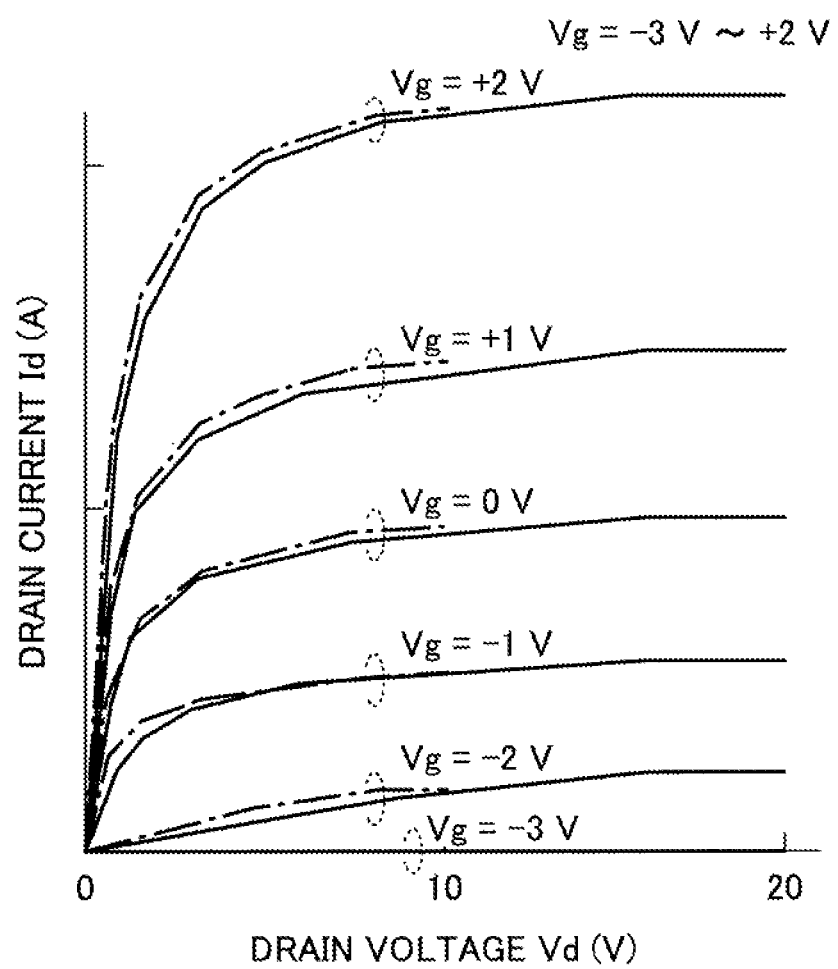
FIG. 29 is a correlation diagram of the drain voltage and the drain current of a semiconductor apparatus according to the third embodiment.

Next, a characteristic of current collapse in the semiconductor apparatus according to the embodiment will be described. FIG. 29 illustrates a relationship between the drain voltage Vd and the drain current Id in a semiconductor apparatus having the structure illustrated in FIG. 26, in cases where the source voltage is set to 0 V, and the gate voltage Vg is changed to make the drain voltage rise up to 10 V, and up to 20 V. Note that FIG. 29 illustrates cases where the gate voltage Vg is changed to be −3, −2, −1, 0, +1, and +2 V.

As illustrated in FIG. 7, in the semiconductor apparatus having the structure illustrated in FIG. 1, the drain current Id is remarkably reduced in the cases where the drain voltage Vd has risen up to 20 V, compared to the cases where the drain voltage Vd has risen up to 10 V, and thus, current collapse is generated. On the other hand, as illustrated in FIG. 29, in the semiconductor apparatus having the structure illustrated in FIG. 26, the drain current Id is not reduced much in the cases where the drain voltage Vd has risen up to 20 V, compared to the cases where the drain voltage Vd has risen up to 10 V, and hence, current collapse is prevented. Therefore, the on-current is not reduced much, and the on-resistance does not become high as much.

(Method of Manufacturing Semiconductor Apparatus)

Next, a method of manufacturing a semiconductor apparatus according to the embodiment will be described based on FIG. 30A to FIG. 34B.

Figure 30A:
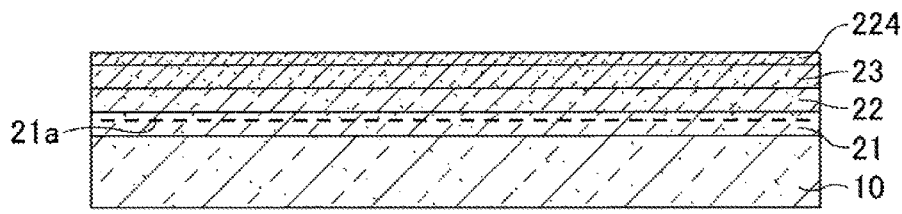
FIGS. 30A-30C are first process views of a method of manufacturing a semiconductor apparatus according to the third embodiment.

First, as illustrated in FIG. 30A, a buffer layer (not illustrated), an electron transit layer 21, an intermediate layer 22, an electron supply layer 23, and a cap layer 224 are sequentially stacked and formed over a substrate 10 by epitaxial growth using MOVPE. Note that in the embodiment, the buffer layer (not illustrated), the electron transit layer 21, the intermediate layer 22, and the electron supply layer 23 may be referred to as the "nitride semiconductor layers". The electron transit layer 21 is formed of i-GaN having the thickness about 3 μm, the intermediate layer 22 is formed of i-AlN having the thickness about 1 nm, and the electron supply layer 23 is formed of i-$In_{0.17}Al_{0.83}N$ having the thickness about 20 nm. The cap layer 224 is formed of MgO having the thickness about 8 nm. This structure generates 2DEG 21a in the electron transit layer 21 in the neighborhood of the interface between the electron transit layer 21 and the intermediate layer 22. Note that a semi-insulative SiC substrate is used for the substrate 10, and the buffer layer (not illustrated) is formed of GaN, AlGaN, or the like.

Figure 30B:
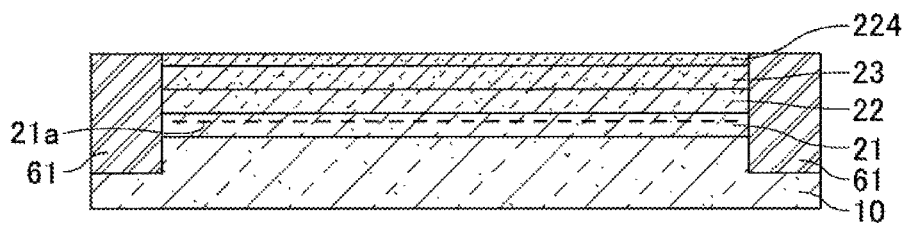

Next, as illustrated in FIG. 30B, element isolating regions 61 are formed in a part of the nitride semiconductor layers and the cap layer 124 formed over the substrate 10, and the substrate 10. Specifically, by applying photoresist on the surface of the cap layer 224, which is then exposed by an exposure device and developed, a photoresist pattern (not illustrated) is formed that has openings in regions where the element isolating regions 61 are to be formed. After that, by applying ion implantation by ions of Ar or the like to the cap layer 224, the nitride semiconductor layers, and the like at the openings of the photoresist pattern, the element isolating regions 61 are formed. Note that when forming the element isolating regions 61, ions of Ar or the like may be injected even into a part of the substrate 10. After that, the photoresist pattern (not illustrated) is removed by an organic solvent or the like.

Figure 30C:
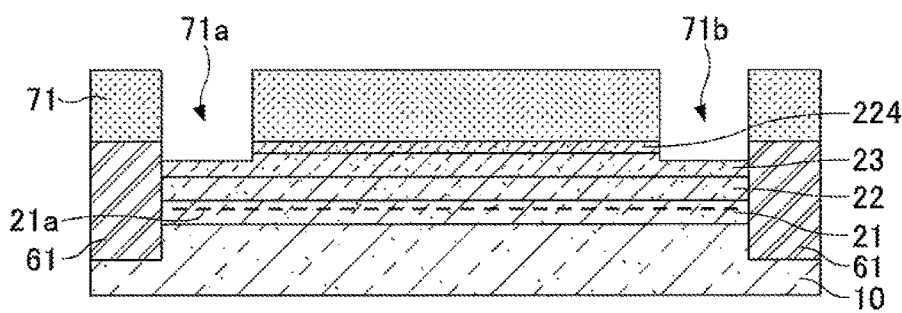

Next, as illustrated in FIG. 30C, a photoresist pattern 71 is formed that has openings in regions where a source electrode 42 and a drain electrode 43 are to be formed, over the cap layer 224. After that, a part of the surfaces of the cap layer 224 and the electron supply layer 23 are removed at the openings 71a and 71b in the photoresist pattern 71. Specifically, by applying photoresist on the surface of the cap layer 224, which is then exposed by an exposure device and developed, the photoresist pattern 71 is formed that has the openings 71a and 71b in the regions where the source electrode 42 and the drain electrode 43 are to be formed. After that, parts of the surfaces of the cap layer 224 and the electron supply layer 23 are removed in the regions where the photoresist pattern is not formed, namely the regions exposed at the openings 71a and 71b in the photoresist pattern 71, by RIE or the like. Note that this etching may remove the nitride semiconductor layers until the surface of the electron supply layer 23 is exposed. Also, a phosphoric acid solvent, an etchant including a chlorine component, or the like may be used for the etching.

Figure 31A:
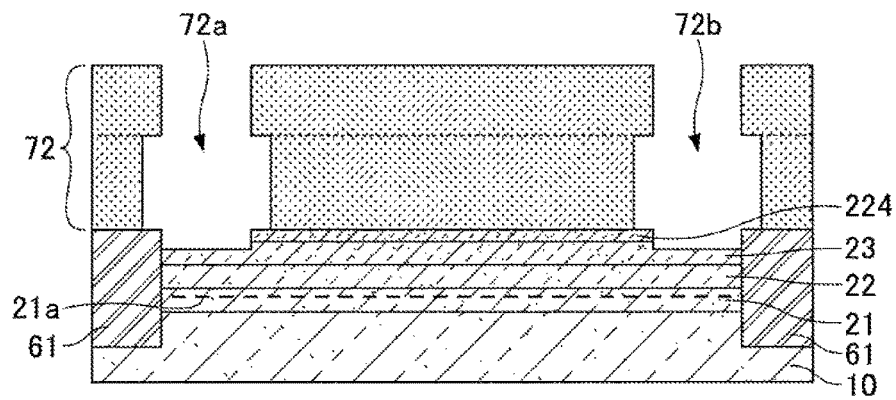
FIGS. 31A-31C are second process views of the method of manufacturing a semiconductor apparatus according to the third embodiment.

Next, as illustrated in FIG. 31A, the photoresist pattern 71 is removed by an organic solvent or the like, and then, a photoresist pattern 72 is formed that has openings 72a and 72b in regions where the source electrode 42 and the drain electrode 43 are to be formed. Specifically, the photoresist pattern 71 is removed by an organic solvent or the like, and then, the photoresist is applied again over the cap layer 224, which is then exposed by an exposure device and developed. Thus, the photoresist pattern 72 is formed that has the openings 72a and 72b in regions where the source electrode 42 and the drain electrode 43 are to be formed. The photoresist pattern 72 may be formed by stacking two layers of photoresist layers as illustrated in the figure.

Figure 31B:
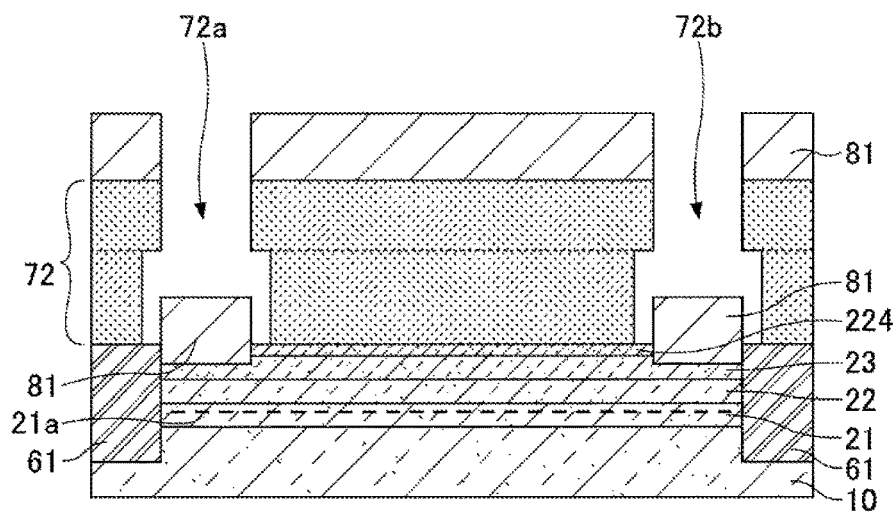

Next, as illustrated in FIG. 31B, over the surface where the photoresist pattern 72 has been formed, a multi-layer metal film 81 made of Ti/Al is formed by vacuum deposition. Specifically, a Ti film is formed by vacuum deposition over the surface where the photoresist pattern 72 has been formed, and an Al film is formed over the formed Ti film.

According to the embodiment, the film thickness of the Ti film to be formed is about 20 nm, and the film thickness of the Al film is about 200 nm.

Figure 31C:
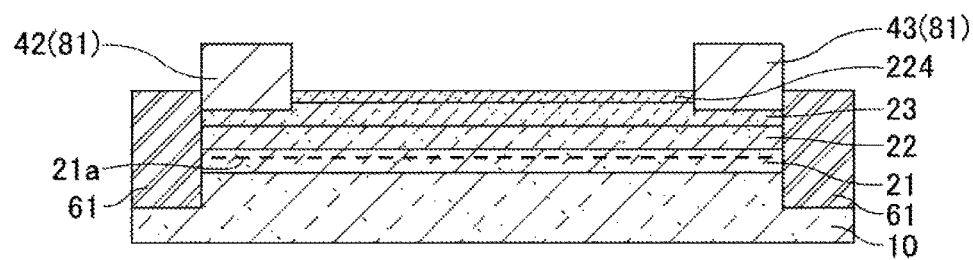

Next, as illustrated in FIG. 31C, by dipping into an organic solvent or the like, the multi-layer metal film 81 formed over the photoresist pattern 72 is removed by liftoff, along with the photoresist pattern 72. Thus, the source electrode 42 and the drain electrode 43 are formed with the remaining multi-layer metal film 81 at the openings 72a and 72b of the photoresist pattern 72. After that, heat treatment is applied at a temperature of 550° C. to establish ohmic contacts between the electron supply layer 23, and the source electrode 42 and the drain electrode 43.

Figure 32A:
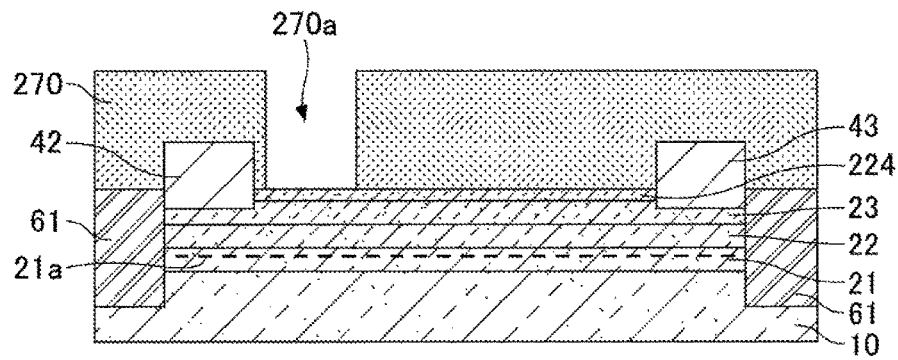
FIGS. 32A-32C are third process views of the method of manufacturing a semiconductor apparatus according to the third embodiment.

Next, as illustrated in FIG. 32A, a photoresist pattern 270 is formed that has an opening 270a in a region where the cap layer 224 is removed between the gate electrode 41 and the source electrode 42. Specifically, by applying photoresist on the surface of the cap layer 224, which is then exposed by an exposure device and developed, the photoresist pattern 270 is formed that has the opening 270a between the gate electrode 41 and the source electrode 42.

Figure 32B:
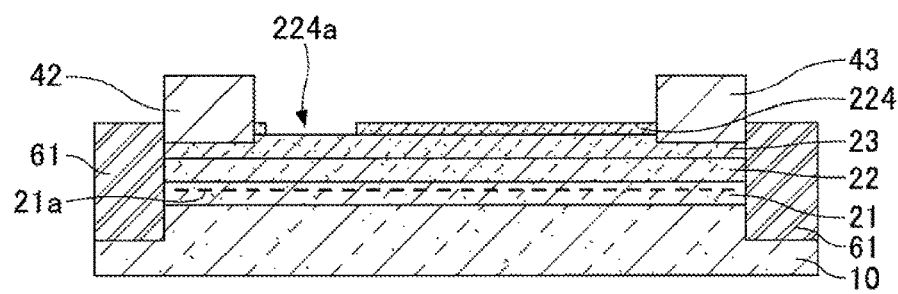

Next, as illustrated in FIG. 32B, the cap layer 224 is removed in the opening 270a of the photoresist pattern 270. Specifically, by applying photoresist on the surface of the cap layer 224, which is then exposed by an exposure device and developed, the photoresist pattern 270 is formed that has the opening 270a in the region where the cap layer 224 is removed between the gate electrode 41 and the source electrode 42. After that, the cap layer 224 exposed in the region where the photoresist pattern 270 is not formed, namely, in the opening 270a of the photoresist pattern 270, is removed by etching or the like. Thus, the cap layer 224 is removed in the region between the gate electrode 41 and the source electrode 42, and the cap layer 224 is formed immediately below the gate electrode 41, and between the gate electrode 41 and the drain electrode 43.

Figure 32C:
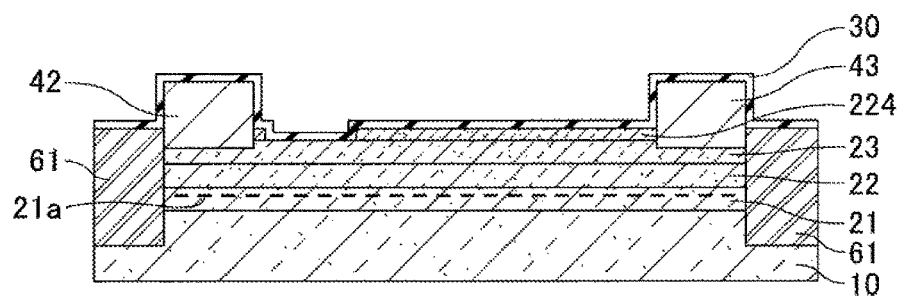

Next, as illustrated in FIG. 32C, the insulation film 30 as a passivation film is formed over the cap layer 224, the electron supply layer 23, and the like. Specifically, the insulation film 30 is formed by forming an SiN film having the thickness about 50 nm over the cap layer 224, the electron supply layer 23, and the like, by using plasma CVD. When forming the insulation film 30 by plasma CVD, for example, silane, ammonia, or the like are used as a raw material gas. The formed insulation film 30 has the refractive index of 2.0 in the wavelength 633 nm, and is a stoichiometric film.

Figure 33A:
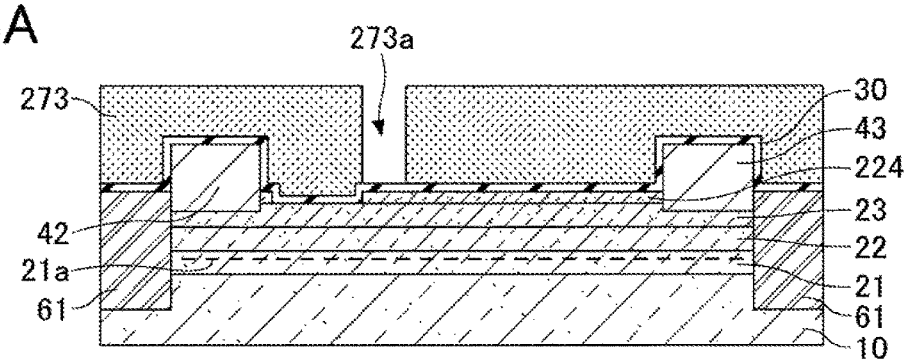
FIGS. 33A-33C are fourth process views of the method of manufacturing a semiconductor apparatus according to the third embodiment.

Next, as illustrated in FIG. 33A, a photoresist pattern 273 having an opening 273a is formed over the insulation film 30. Specifically, by applying photoresist over the insulation film 30, which is then exposed by an exposure device and developed, the photoresist pattern 273 is formed that has the opening 273a having the width of 0.1 μm.

Figure 33B:
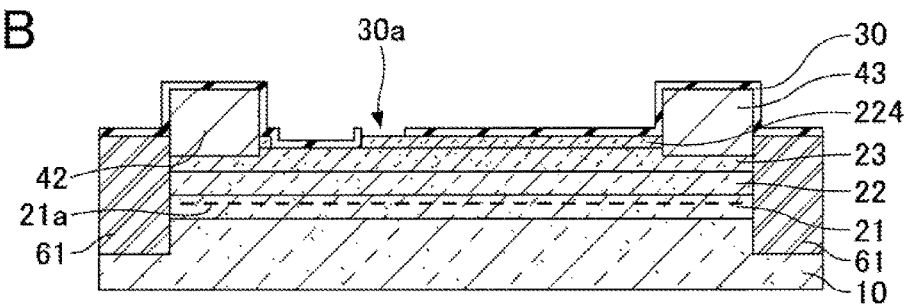

Next, as illustrated in FIG. 33B, the insulation film 30 in the opening 273a of the photoresist pattern 273 is removed by dry etching such as RIE or the like that uses $SF_6$ as etching gas. Thus, the insulation film 30 is formed having the opening 30a in the region where the gate electrode 41 is to be formed. After that, the photoresist pattern 273 is removed by an organic solvent or the like.

Figure 33C:
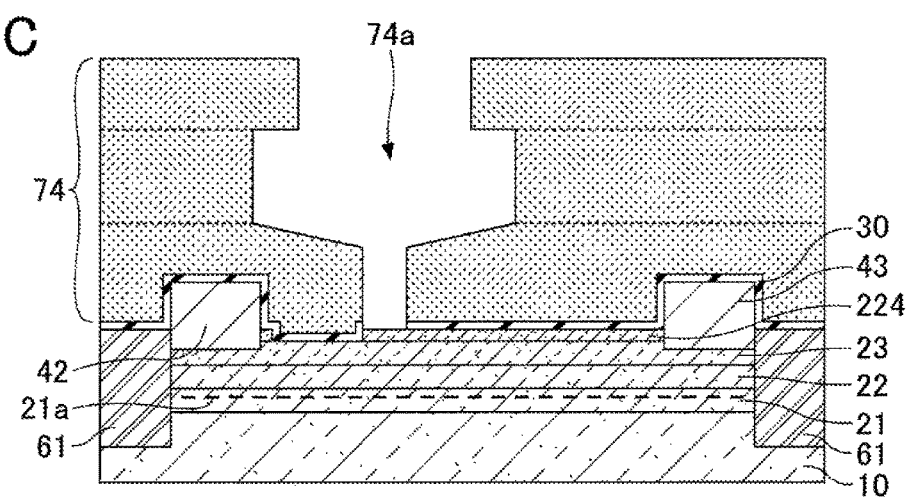

Next, as illustrated in FIG. 33C, a photoresist pattern 74 is formed to form the gate electrode 41 over the insulation film 30. This photoresist pattern 74 is formed of stacked three layers of electron beam resist layers, and has an opening 74a in a region where the gate electrode 41 is to be formed, namely, in the opening 30a of the insulation film 30. Specifically, by repeating application of electron beam resist over the cap layer 224 and the insulation film 30, three layers of electron beam resist layers are formed, and then, by repeating drawing by an electron beam drawing device and development, the opening 74a is formed in the three layers of electron beam resist layers. Thus, the photoresist pattern 74 having the opening 74a is formed. The opening 74a in the photoresist pattern 74 is formed to have the widths of 0.8 μm, 1.3 μm, and 0.15 μm at the three layers of electron beam resist layers, respectively, in order from the top.

Figure 34A:
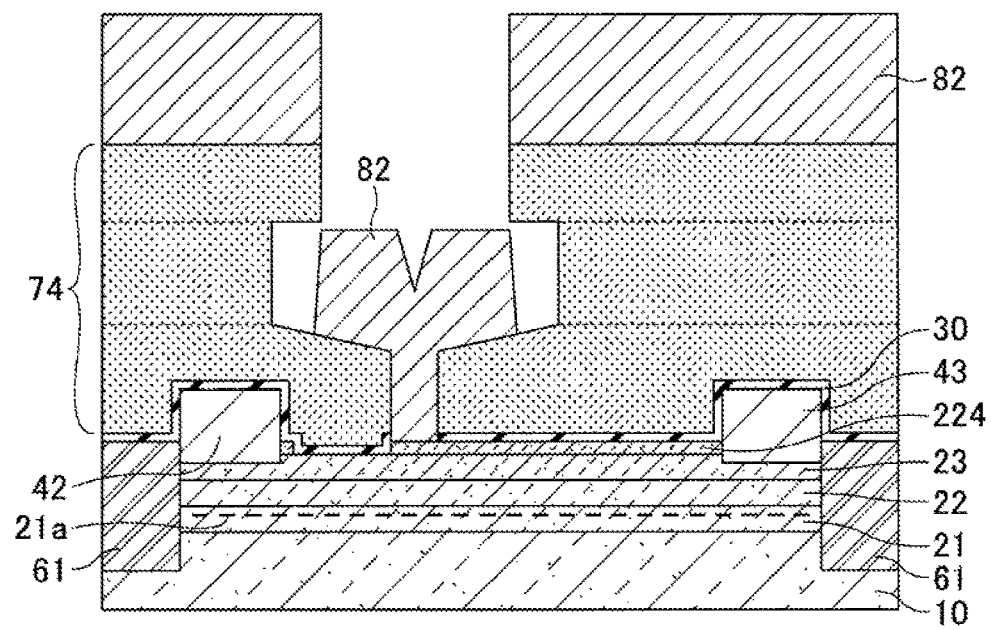
FIGS. 34A-34B are fifth process views of the method of manufacturing a semiconductor apparatus according to the third embodiment.

Next, as illustrated in FIG. 34A, over the surface where the photoresist pattern 74 is formed, a multi-layer metal film 82 made of Ni/Au is formed by vacuum deposition. Specifically, an Ni film is formed by vacuum deposition over the surface where the photoresist pattern 74 has been formed, and an Au film is formed over the formed Ni film. According to the embodiment, the film thickness of the Ni film to be formed is about 10 nm, and the film thickness of the Al film is about 300 nm.

Figure 34B:
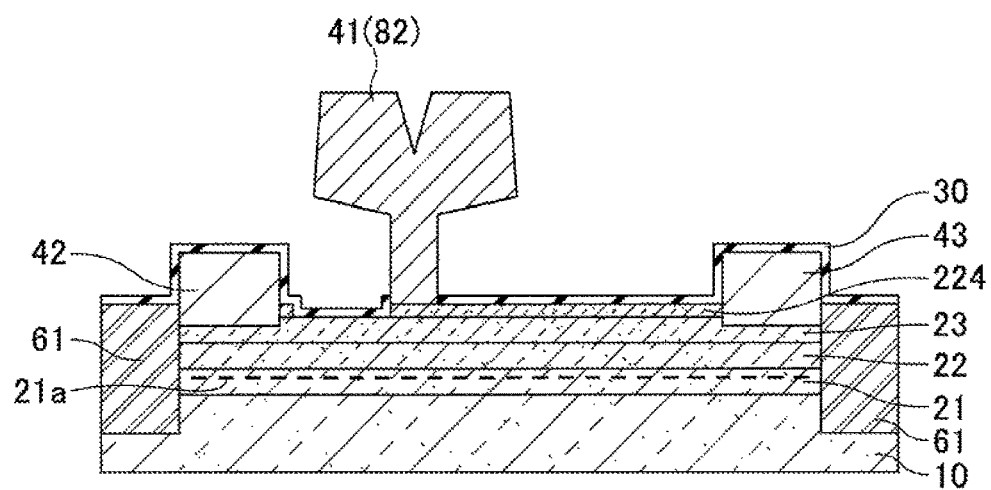

Next, as illustrated in FIG. 34B, by dipping into an organic solvent or the like, the multi-layer metal film 82 formed over the photoresist pattern 74 is removed by liftoff, along with the photoresist pattern 74. Thus, the gate electrode 41 is formed with the remaining multi-layer metal film 82 at the opening 74a of the photoresist pattern 74.

By the process described above, the semiconductor apparatus according to the embodiment can be manufactured.

Note that contents other than the above are substantially the same as in the second embodiment.

Fourth Embodiment (Semiconductor Apparatus)

Figure 35:
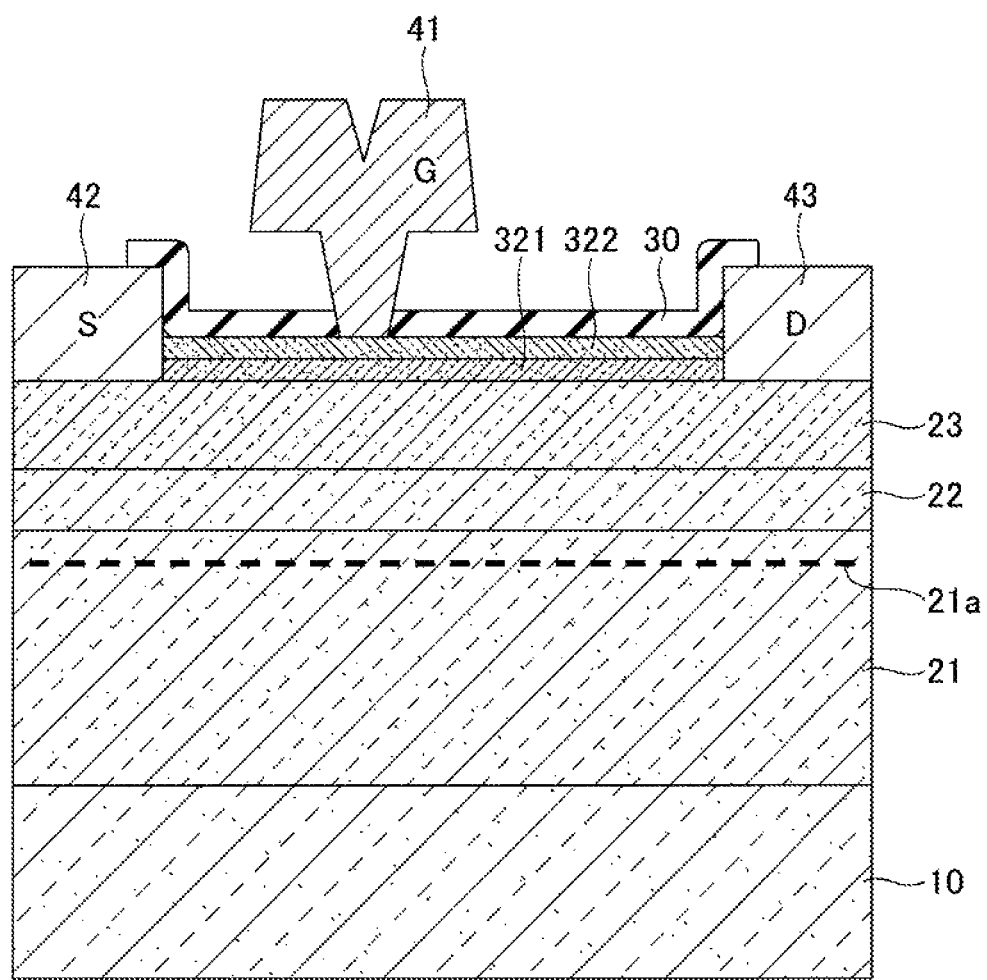
FIG. 35 is a structural diagram of a semiconductor apparatus according to a fourth embodiment.

Next, a semiconductor apparatus according to a fourth embodiment will be described based on FIG. 35. As illustrated in FIG. 35, the semiconductor apparatus according to the embodiment has a buffer layer (not illustrated), an electron transit layer 21, an intermediate layer 22, an electron supply layer 23, a first cap layer 321, and a second cap layer 322, stacked over a substrate 10. According to the embodiment, the electron transit layer 21 is formed of i-GaN, the intermediate layer 22 is formed of AlN, and the electron supply layer 23 is formed of InAlN. Also, the first cap layer 321 is formed of InGaN, and the second cap layer 322 is formed of MgO. This structure generates 2DEG 21a in the electron transit layer 21 in the neighborhood of the interface between the electron transit layer 21 and the intermediate layer 22. Note that the substrate 10 is formed of a semi-insulative SiC substrate. A gate electrode 41 is formed over the second cap layer 322, and a source electrode 42 and a drain electrode 43 are formed over the electron supply layer 23. A region over the second cap layer 322 where the gate electrode 41 is not formed, has an insulation film 30 of SiN or the like formed as a passivation film. The first cap layer 321 may be formed of a material other than InGaN as long as a quantum well is formed with the material, as in the first embodiment. Also, the second cap layer 322 is formed of a material that has a wider band gap than a material of the electron supply layer 23, and may be formed of BeS, BeSe, or the like, but MgO is preferable.

Figure 36:
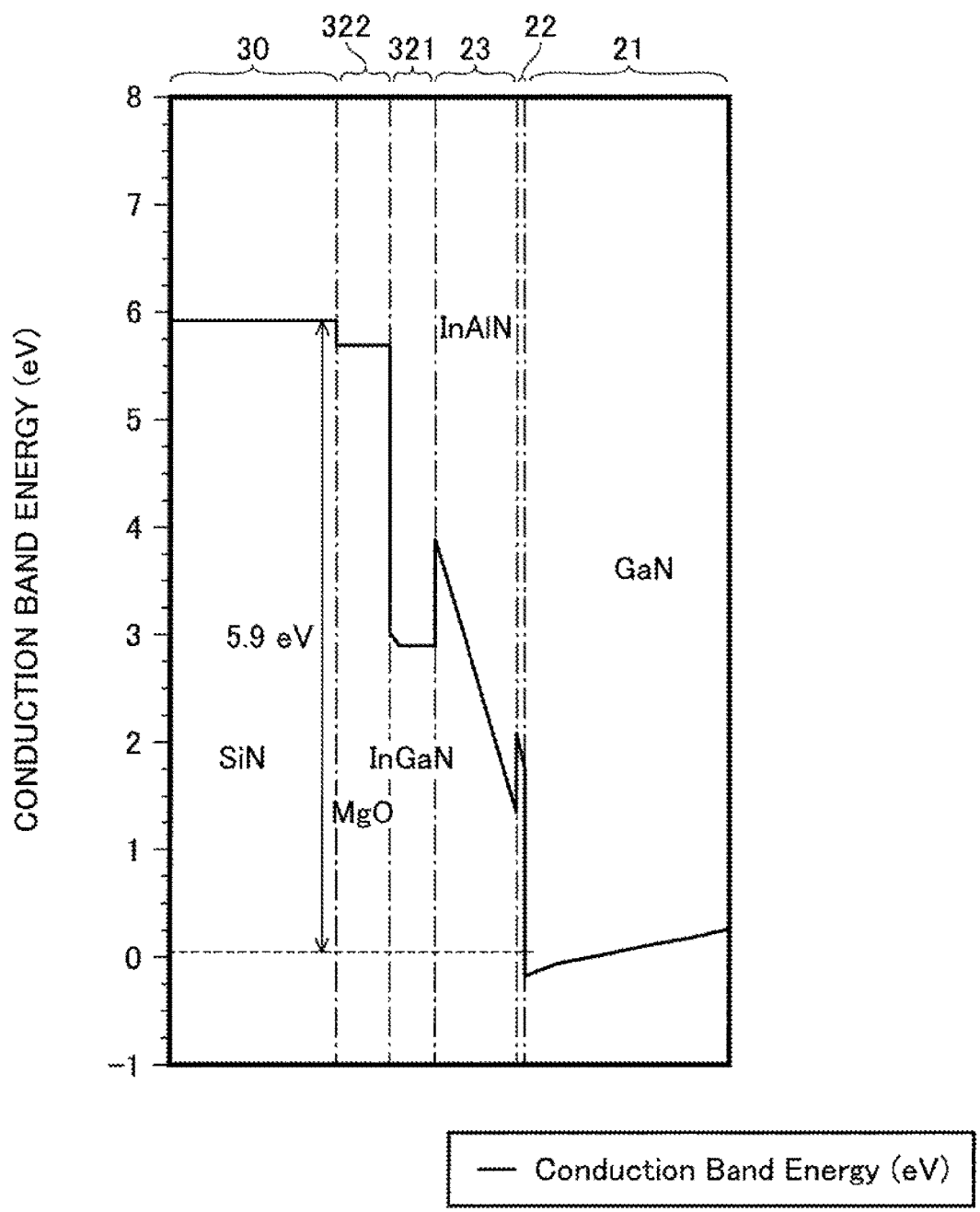
FIG. 36 is a first band diagram of a semiconductor apparatus in the direction perpendicular to the substrate surface according to the fourth embodiment.
Figure 37:
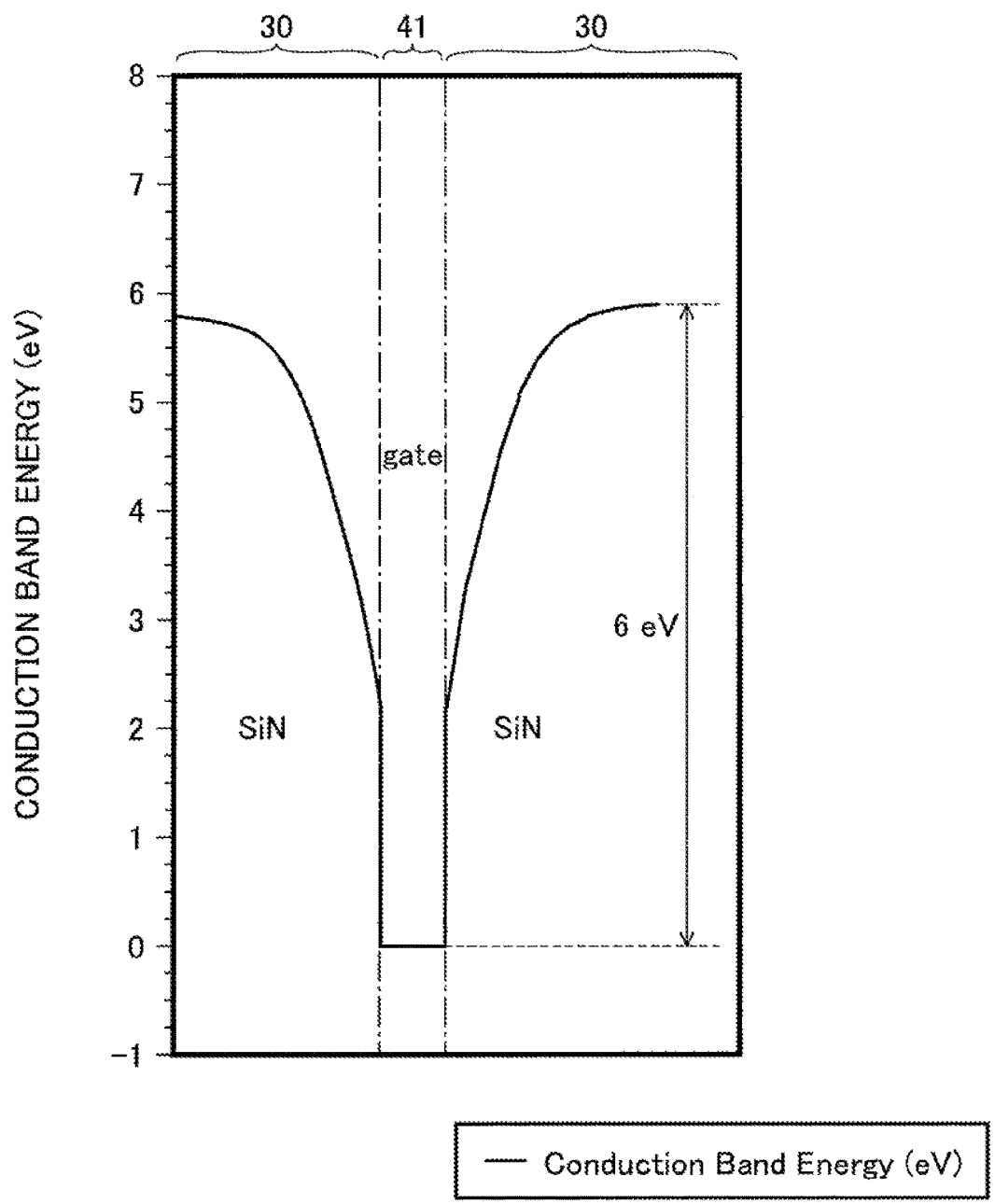
FIG. 37 is a band diagram of a semiconductor apparatus in the direction along the substrate surface according to the fourth embodiment.

Band structures of the semiconductor apparatus according to the embodiment will be described based on FIG. 36 and FIG. 37. FIG. 36 is a band diagram of the semiconductor apparatus in the direction perpendicular to the substrate surface, and FIG. 37 is a band diagram of the semiconductor apparatus in the direction along the substrate surface, according to the embodiment. Note that the thickness of the first cap layer 321 and the second cap layer 322 is about 8 nm, the thickness of the electron supply layer 23 is 12 nm.

As illustrated in FIG. 36, formed of i-GaN, the difference ΔEc along the bottom of the conduction band between the electron transit layer 21 formed of i-GaN and the insulation film 30 formed of SiN, is about 5.9 eV. Therefore, even if a high voltage is applied to the drain electrode 43, electrons of the 2DEG 21a are not injected into the insulation film 30 because the barrier from the electron transit layer 21 to the insulation film 30 is high.

Also, in the semiconductor apparatus according to the embodiment, although the film thickness of the electron supply layer 23 is 12 nm, the 2DEG 21a can be generated, and the high frequency characteristic can be improved. Note that a band diagram in a case where the film thickness of the electron supply layer 23 is 12 nm, and only the second cap layer 322 is formed by MgO, is as illustrated in FIG. 20. As illustrated in FIG. 20, when the film thickness of the electron supply layer 23 is 12 μm, 2DEG 21a is not generated in the electron transit layer 21. In the semiconductor apparatus according to the embodiment, even though the film thickness of the electron supply layer 23 is 12 μm, the 2DEG 21a is generated, and hence, the high frequency characteristic can be improved.

Also, as illustrated in FIG. 37, the bottom of the conduction band is raised because SiN forming the insulation film 30 is formed over the second cap layer 322 formed of MgO. Therefore, the difference $E_{c\_pass}$ between the Fermi level in the gate electrode 41 and the bottom of the conduction band of SiN forming the insulation film 30 becomes as high as about 6.0 eV, and hence, electrons are not injected into the insulation film 30 from the gate electrode 41.

Note that contents other than the above are substantially the same as in the first embodiment.

Fifth Embodiment

Figure 38:
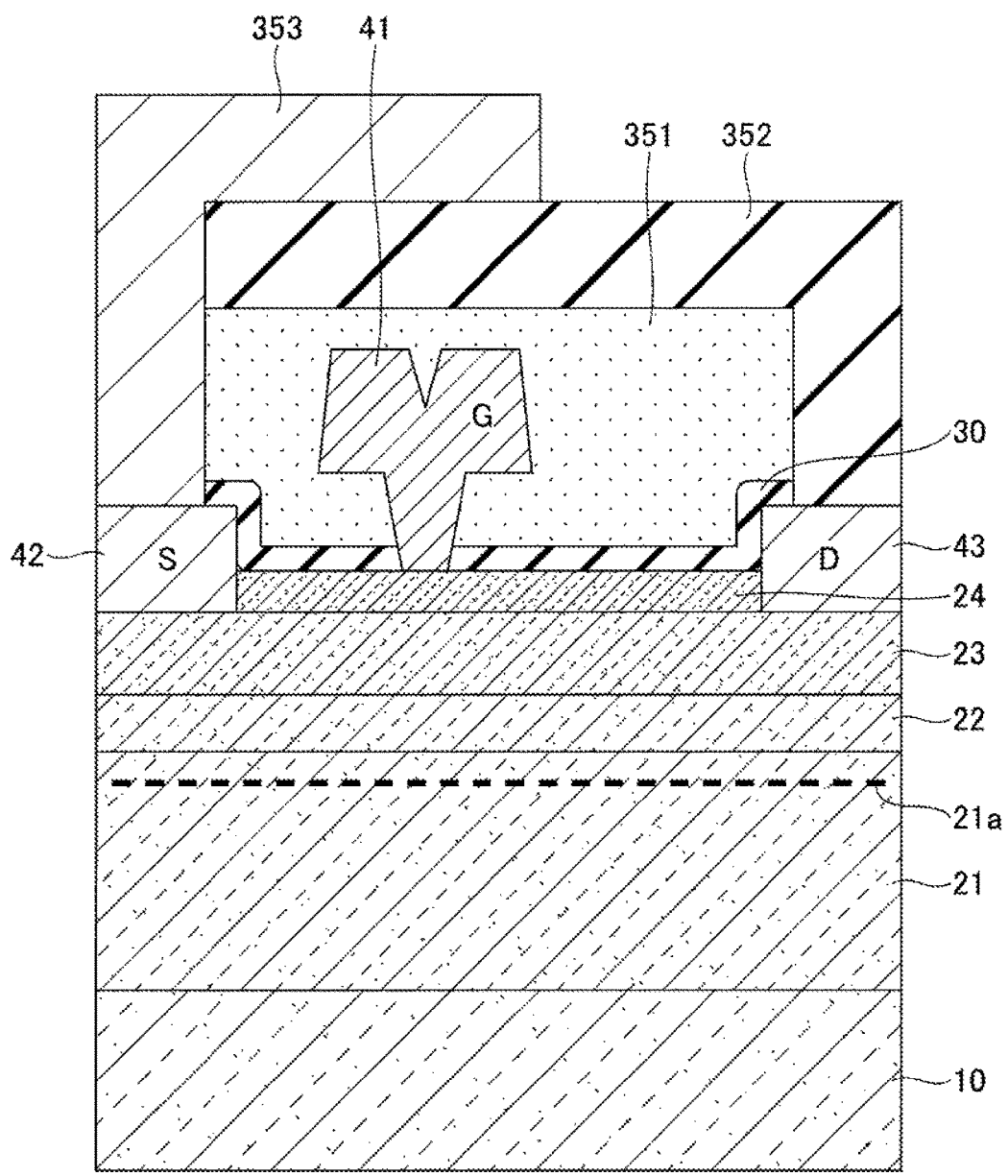
FIG. 38 is a first structural diagram of a semiconductor apparatus according to a fifth embodiment.

Next, a fifth embodiment will be described. As illustrated in FIG. 38, the semiconductor apparatus according to the embodiment has a structure in which an interlayer region 351, an interlayer insulation film 352, and a wiring layer 353 are stacked and formed around an insulation film and a gate electrode 41 as in the semiconductor apparatus according to the first embodiment. Specifically, around the insulation film 30 and the gate electrode 41 as in the semiconductor apparatus according to the first embodiment, the interlayer region 351 is formed, the interlayer insulation film 352 is formed around the interlayer region 351, and the wiring layer 353 is formed of a metal film over the interlayer insulation film 352. Note that the interlayer region 351 is formed of a low-k film or a space having the relative permittivity less than or equal to 3.2, and the interlayer insulation film 352 is formed of polyimide or the like.

In the semiconductor apparatus according to the embodiment, since the multi-layer wiring film structure and the field plate structure have weaker effects to prevent electron from transitioning into the insulation film 30, only the structure of the semiconductor apparatus according to the first embodiment solves the problem.

Figure 39:
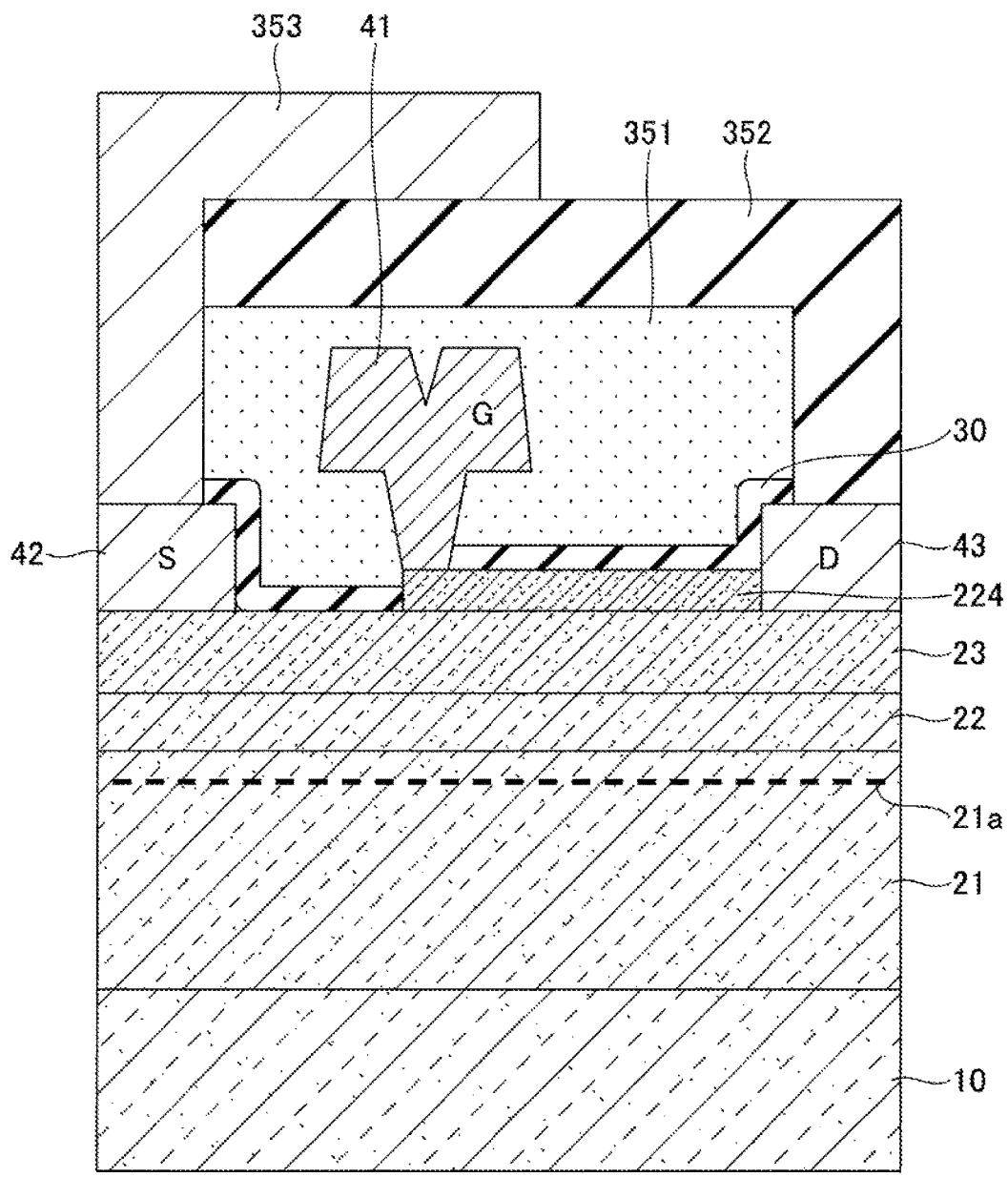
FIG. 39 is a second structural diagram of a semiconductor apparatus according to the fifth embodiment.

The embodiment is applicable to semiconductor apparatuses according to the second to fifth embodiments. FIG. 39 illustrates a case in which the structure according to the embodiment is applied to a semiconductor apparatus according to the third embodiment.

Sixth Embodiment

Next, a sixth embodiment will be described. The embodiment relates to a semiconductor device, a power source apparatus, and a high-frequency amplifier.

Figure 40:
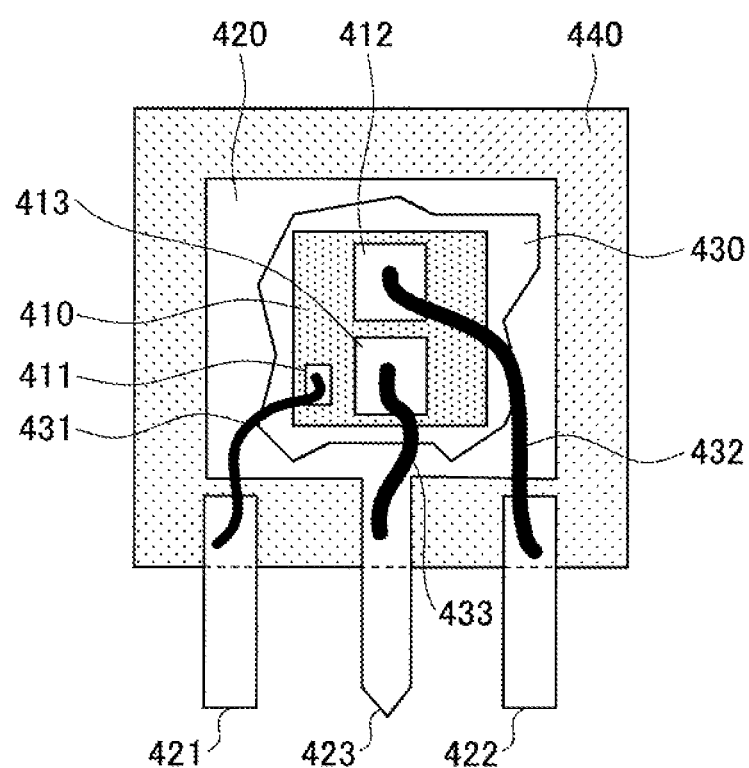
FIG. 40 is a diagram illustrating a semiconductor apparatus installed in a discrete package according to a sixth embodiment.

A semiconductor device according to the embodiment includes a semiconductor apparatus according to one of the first to fifth embodiments which is contained in a discrete package, and will be described based on FIG. 40. Note that FIG. 40 schematically illustrates the inside of the discretely packaged semiconductor apparatus in which positions of the electrodes and the like may be different from those in the first to fifth embodiments.

First, a semiconductor apparatus manufactured according to one of the first to fifth embodiments is cut off by dicing or the like to form a semiconductor chip 410, which is a HEMT made of GaN semiconductor materials. The semiconductor chip 410 is fixed on a lead frame 420 by a die attachment agent 430 such as solder. Note that this semiconductor chip 410 corresponds to a semiconductor apparatus according to one of the first to fifth embodiments.

Next, a gate electrode 411 is connected with a gate lead 421 by a bonding wire 431, a source electrode 412 is connected with a source lead 422 by a bonding wire 432, and a drain electrode 413 is connected with a drain lead 423 by a bonding wire 433. Note that the bonding wires 431, 432, and 433 are formed of a metal material such as Al. Also, the gate electrode 411 is a gate electrode pad according to the embodiment, which is connected with the gate electrode 21 of the semiconductor apparatus according to one of the first to fifth embodiments. Also, the source electrode 412 is a source electrode pad, which is connected with the source electrode 22 of the semiconductor apparatus according to one of the first to fifth embodiments. Also, the drain electrode 413 is a drain electrode pad, which is connected with the drain electrode 23 of the semiconductor apparatus according to one of the first to fifth embodiments.

Next, resin sealing is performed by a transfer molding method using a mold resin 440. Thus, the HEMT made of GaN semiconductor materials can be manufactured as the discretely packaged semiconductor apparatus.

Next, a power supply apparatus and a high frequency amplifier will be described according to the embodiment. The power source apparatus and the high-frequency amplifier according to the embodiment use semiconductor apparatuses in one of the first to fifth embodiments.

Figure 41:
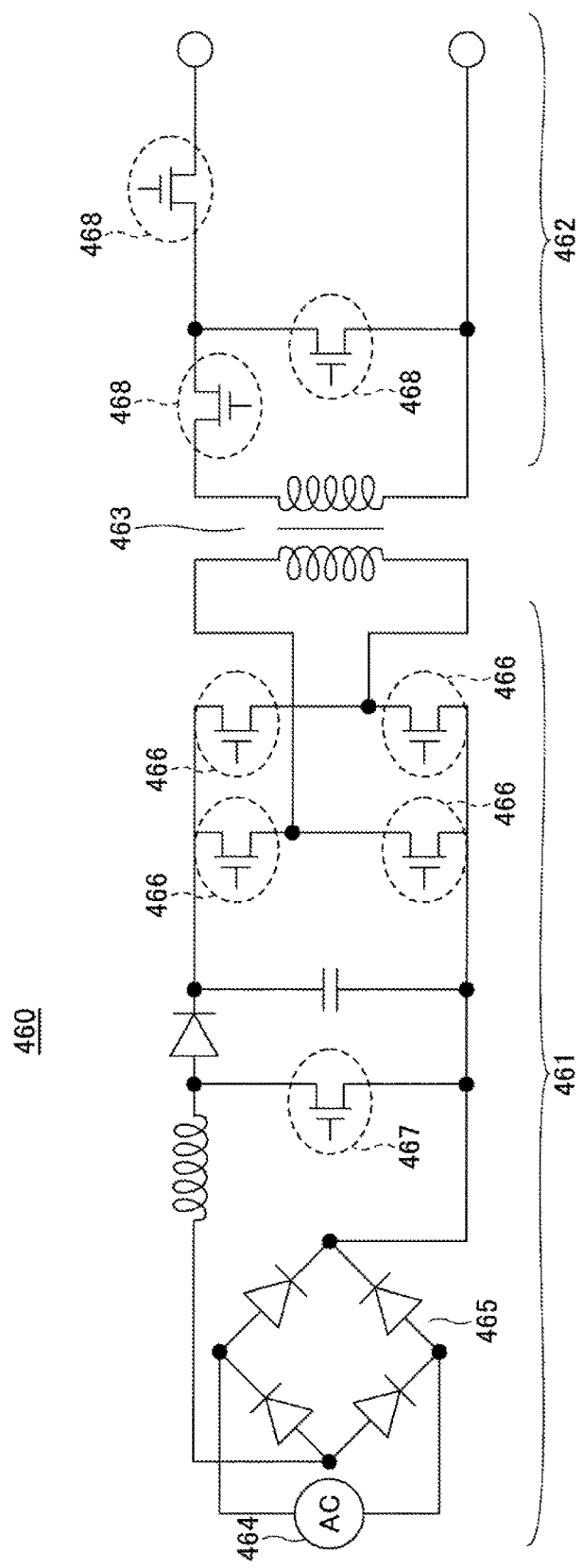
FIG. 41 is a circuit diagram of a power supply apparatus according to the sixth embodiment.

First, based on FIG. 41, the power source apparatus will be described according to the embodiment. The power source apparatus 460 according to the embodiment includes a high-voltage primary circuit 461, a low-voltage secondary circuit 462, and a transformer 463 disposed between the primary circuit 461 and the secondary circuit 462. The primary circuit 461 includes an AC power supply 464, a so-called "bridge rectifier circuit" 465, multiple (four in the example in FIG. 41) switching elements 466, and a switching element 467. The secondary circuit 462 includes multiple (three in the example in FIG. 41) switching elements 468. In the example in FIG. 41, semiconductor apparatuses according to one of the first to fifth embodiments are used as the switching elements 466 and 467 in the primary circuit 461. Note that it is preferable that the switching elements 466 and 467 in the primary circuit 461 are normally-off semiconductor apparatuses. Also, the switching elements 468 used in the secondary circuit 462 use usual MISFETs (metal insulator semiconductor field effect transistors) formed of silicon.

Figure 42:
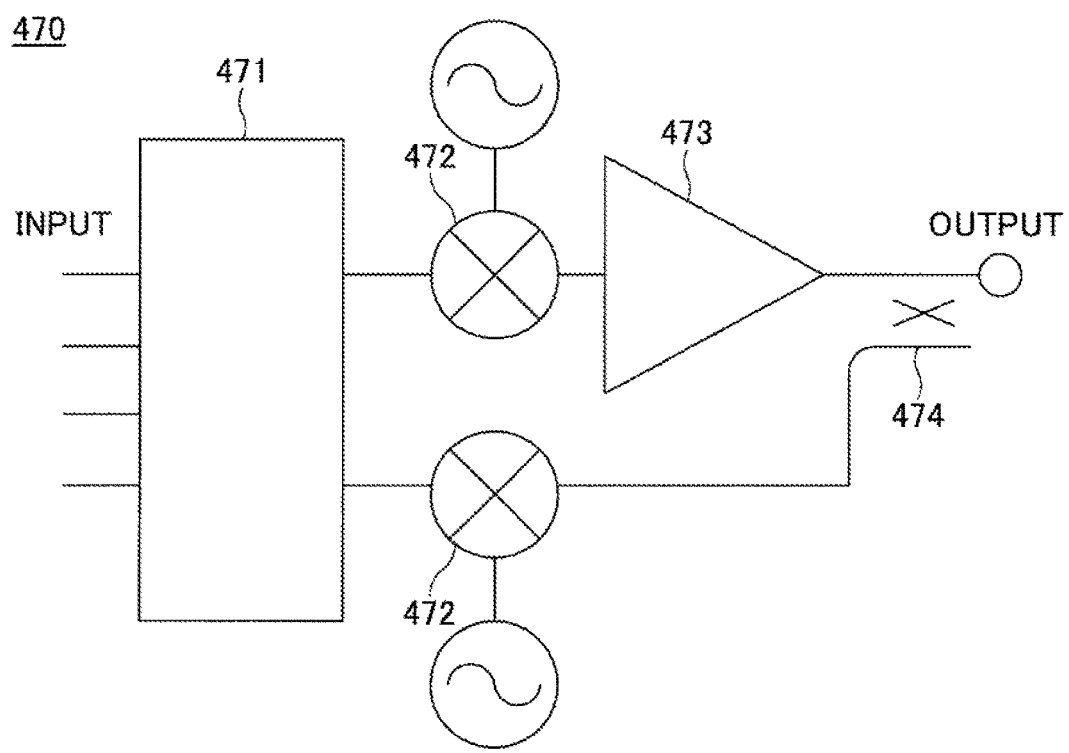
FIG. 42 is a structural diagram of a high-frequency amplifier according to the sixth embodiment.

Next, based on FIG. 42, the high-frequency amplifier will be described according to the embodiment. The high frequency amplifier 470 according to the embodiment may be used for, for example, a power amplifier in a base station of cellular phones. This high-frequency amplifier 470 includes a digital predistortion circuit 471, mixers 472, a power amplifier 473, and a directional coupler 474. The digital predistortion circuit 471 compensates for non-linear distortion of an input signal. One of the mixers 472 mixes the input signal having non-linear distortion compensated, with an alternating current signal. The power amplifier 473 amplifies the input signal having been mixed with the alternating current signal. In the example illustrated in FIG. 42, the power amplifier 473 includes a semiconductor apparatus according to one of the first to fifth embodiments. The directional coupler 474 monitors the input signal and an output signal. In the circuit illustrated in FIG. 42, by turning on/off a switch, for example, it is possible to mix the output signal with an alternating current signal by using the other mixer 472, and to transmit the mixed signal to the digital predistortion circuit 471.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor apparatus, comprising:
   an electron transit layer formed of a nitride semiconductor over a substrate;
   an electron supply layer formed of a nitride semiconductor including In over the electron transit layer;
   a cap layer formed of a nitride semiconductor over the electron supply layer;
   an insulation film formed over the cap layer;
   a source electrode and a drain electrode formed over the electron transit layer or the electron supply layer; and
   a gate electrode formed in direct contact with the cap layer,
   wherein a quantum well is formed by the cap layer,
   the cap layer is formed of $In_yGa_{1-y}N$,
   a value of Y in $In_yGa_{1-y}N$ is greater than or equal to 0.05 and less than or equal to 0.2,
   the cap layer is formed between the gate electrode and the drain electrode, and
   the insulation film is formed over the cap layer between the gate electrode and the drain electrode, and formed over the electron supply layer between the gate electrode and the source electrode.

2. The semiconductor apparatus as claimed in claim 1, wherein the electron supply layer is formed of a material including InAlN.

3. The semiconductor apparatus as claimed in claim 1, wherein the electron transit layer is formed of a material including GaN.

4. The semiconductor apparatus as claimed in claim 1, wherein an intermediate layer is formed between the electron transit layer and the electron supply layer, and the intermediate layer is formed of a material including AlN.

5. The semiconductor apparatus as claimed in claim 1, wherein the insulation film is formed of a material including SiN.

6. The semiconductor apparatus as claimed in claim 1, wherein an interlayer insulation film is formed above the insulation film and the gate electrode, wiring is formed over the interlayer insulation film,
an interlayer region is formed between the insulation film, and the gate electrode and the interlayer insulation film, and
the interlayer region is formed of a space or a low-k film.

7. A power source apparatus comprising:
the semiconductor apparatus as claimed in claim 1.

8. An amplifier comprising:
the semiconductor apparatus as claimed in claim 1.

9. The semiconductor apparatus as claimed in claim 1, wherein the cap layer is disposed between the insulation film and the electron supply layer, and the quantum well formed by the cap layer provides a difference in a bottom of a conduction band between the cap layer and the insulation film greater than or equal to 1.6 eV.

10. A semiconductor apparatus, comprising:
an electron transit layer formed of a nitride semiconductor over a substrate;
an electron supply layer formed of a nitride semiconductor including In over the electron transit layer;
a cap layer formed of a nitride semiconductor over the electron supply layer;
an insulation film formed over the cap layer;
a source electrode and a drain electrode formed over the electron transit layer or the electron supply layer; and
a gate electrode formed in direct contact with the cap layer,
wherein the cap layer is formed of a material having a wider band gap than the electron supply layer,
the cap layer is formed of $In_YGa_{1-Y}N$,
a value of Y in $In_YGa_{1-Y}N$ is greater than or equal to 0.05 and less than or equal to 0.2,
the cap layer is formed between the gate electrode and the drain electrode, and
the insulation film is formed over the cap layer between the gate electrode and the drain electrode, and formed over the electron supply layer between the gate electrode and the source electrode.

11. The semiconductor apparatus as claimed in claim 10, wherein the cap layer is formed of a material including MgO.

12. A semiconductor apparatus, comprising:
an electron transit layer formed of a nitride semiconductor over a substrate;
an electron supply layer formed of a nitride semiconductor including In over the electron transit layer;
a first cap layer formed of a nitride semiconductor over the electron supply layer;
a second cap layer formed over the first cap layer;
an insulation film formed over the second cap layer;
a source electrode and a drain electrode formed over the electron transit layer or the electron supply layer; and
a gate electrode formed in direct contact with the second cap layer,
wherein a quantum well is formed by the first cap layer,
the second cap layer is formed of a material having a wider band gap than the electron supply layer,
the first cap layer is formed of $In_YGa_{1-Y}N$,
a value of Y in $In_YGa_{1-Y}N$ is greater than or equal to 0.05 and less than or equal to 0.2,
the first and second cap layers are formed between the gate electrode and the drain electrode, and
the insulation film is formed over the second cap layer between the gate electrode and the drain electrode, and formed over the electron supply layer between the gate electrode and the source electrode.

13. The semiconductor apparatus as claimed in claim 12, wherein the second cap layer is formed of a material including MgO.

* * * * *